(12) United States Patent
Lin et al.

(10) Patent No.: US 12,062,576 B2
(45) Date of Patent: Aug. 13, 2024

(54) SEMICONDUCTOR DEVICES WITH A RARE EARTH METAL OXIDE LAYER

(71) Applicant: Taiwan Semiconductor Manufacturing Co., Ltd., Hsinchu (TW)

(72) Inventors: Han-Yu Lin, Hsinchu (TW); Szu-Hua Chen, Hsinchu (TW); Kuan-Kan Hu, Hsinchu (TW); Kenichi Sano, Hsinchu (TW); Po-Cheng Wang, Kaohsiung (TW); Wei-Yen Woon, Hsinchu (TW); Pinyen Lin, Rochester, NY (US); Che Chi Shih, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 437 days.

(21) Appl. No.: 17/533,372

(22) Filed: Nov. 23, 2021

(65) Prior Publication Data

US 2023/0020731 A1 Jan. 19, 2023

Related U.S. Application Data

(60) Provisional application No. 63/222,863, filed on Jul. 16, 2021.

(51) Int. Cl.
*H01L 21/8234* (2006.01)
*H01L 29/06* (2006.01)
(Continued)

(52) U.S. Cl.
CPC ......... *H01L 21/823431* (2013.01); *H01L 21/823412* (2013.01); *H01L 21/823418* (2013.01);
(Continued)

(58) Field of Classification Search
CPC ..... H01L 21/823412; H01L 21/823418; H01L 21/823431; H01L 21/823481; H01L 27/088; H01L 27/0886; H01L 29/0665; H01L 29/0673; H01L 29/42392; H01L 29/66439; H01L 29/66545; H01L 29/6675; H01L 29/66795; H01L 29/785;
(Continued)

(56) References Cited

U.S. PATENT DOCUMENTS 9,093,530 B2  7/2015  Huang et al.
9,171,929 B2  10/2015 Lee et al.
(Continued)

*Primary Examiner* — Cheung Lee
(74) *Attorney, Agent, or Firm* — Sterne, Kessler, Goldstein & Fox P.L.L.C.

(57) ABSTRACT

The present disclosure describes a semiconductor device with a rare earth metal oxide layer and a method for forming the same. The method includes forming fin structures on a substrate and forming superlattice structures on the fin structures, where each of the superlattice structures includes a first-type nanostructured layer and a second-type nanostructured layer. The method further includes forming an isolation layer between the superlattice structures, implanting a rare earth metal into a top portion of the isolation layer to form a rare earth metal oxide layer, and forming a polysilicon structure over the superlattice structures. The method further includes etching portions of the superlattice structures adjacent to the polysilicon structure to form a source/drain (S/D) opening and forming an S/D region in the S/D opening.

20 Claims, 28 Drawing Sheets

(51) Int. Cl.
*H01L 29/423* (2006.01)
*H01L 29/66* (2006.01)
*H01L 29/786* (2006.01)

(52) U.S. Cl.
CPC .... *H01L 29/0665* (2013.01); *H01L 29/42392* (2013.01); *H01L 29/6675* (2013.01); *H01L 29/78618* (2013.01); *H01L 29/78672* (2013.01); *H01L 29/7869* (2013.01); *H01L 29/78696* (2013.01)

(58) Field of Classification Search
CPC ......... H01L 29/78618; H01L 29/78672; H01L 29/7869; H01L 29/78696
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

FIG. 16

SEMICONDUCTOR DEVICES WITH A RARE EARTH METAL OXIDE LAYER

CROSS-REFERENCE TO RELATED APPLICATION

This application claims the benefit of U.S. Provisional Patent Application No. 63/222,863, filed on Jul. 16, 2021 and titled "Implanted Hybrid Fin for SSD Etch," the disclosure of which is incorporated by reference herein in its entirety.

BACKGROUND

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around (GAA) field effect transistors (FETs) and fin field effect transistors (finFETs).

BRIEF DESCRIPTION OF THE DRAWINGS

Aspects of the present disclosure are best understood from the following detailed description when read with the accompanying figures.

FIGS. 3-20 illustrate isometric views of a semiconductor device with a rare earth metal oxide layer at various stages of its fabrication process, in accordance with some embodiments.

DETAILED DESCRIPTION

Figure 1A:
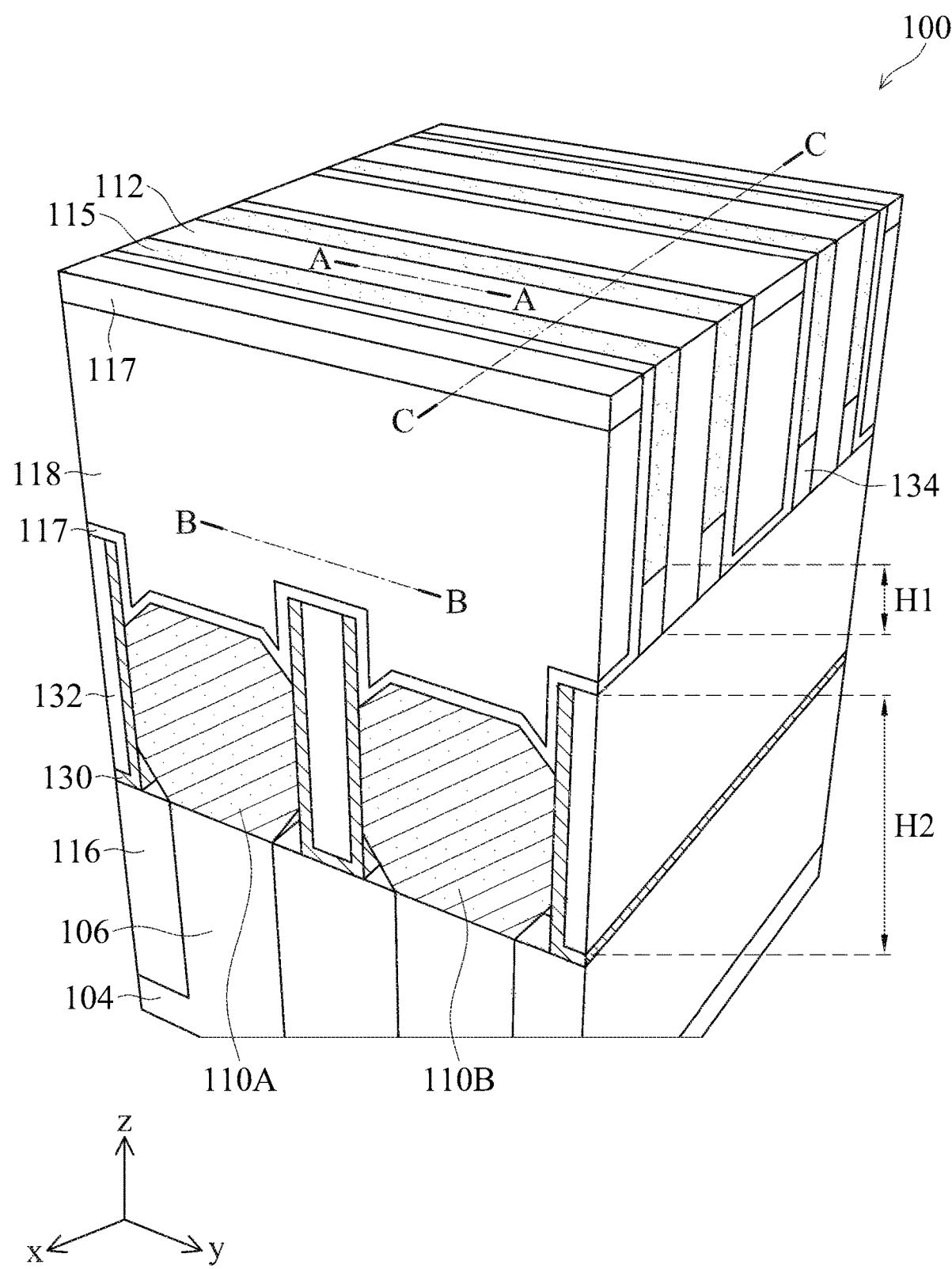
FIG. 1A illustrates an isometric view of a semiconductor device with a rare earth metal oxide layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1D, 3-8A, 8D-8E, 9-16, 17A-17B, and 18-20 with the same annotations applies to each other, unless mentioned otherwise.

As the semiconductor industry continues to scale down the dimensions of semiconductor devices, circuit complexity has increased at all device levels. Gate-all-around (GAA) field effect transistors (FETs) and fin field effect transistors (finFETs) increase device density and improve device performance. GAA FETs and finFETs include a pair of source/drain (S/D) regions formed on opposite sides of a channel region and a gate structure formed on the channel region. In some embodiments, there can be multiple S/D regions on the same side of the channel region, with an isolation layer between each two of the multiple S/D regions. When forming the S/D regions, portions of fin structures adjacent to the gate structure can be removed by etching. The S/D regions can be epitaxially grown in the removed portions of the fin structures. During the etching of the portions of the fin structures, a top portion of the isolation layer can also be removed. If too much of the top portion of the isolation layer is removed, the epitaxially-grown S/D regions can merge together over the isolation layer. The merged S/D regions can increase the complexity of the circuit design and reduce device performance and reliability.

The present disclosure provides example FET devices (e.g., GAA FETs, finFETs, and planar FETs) with a rare earth metal oxide layer in a semiconductor device and/or in an integrated circuit (IC) and an example method for fabricating the same. The rare earth metal oxide layer can be formed on the top portion of the isolation layer to protect the top portion of the isolation layer from etching. There can be two methods for forming the rare earth metal oxide layer on the top portion of the isolation layer. The first method can be rare earth metal implantation on the top portion of both the isolation layer and the fin structures. There can be a post-implantation anneal. The rare earth metal can react with the isolation layer to form the rare earth metal oxide layer. The top portion of the implanted fin structures can be removed, leaving the isolation layer with the rare earth metal oxide layer on the top portion of the isolation layer. The second method can be rare earth metal oxide deposition. The top portion of the isolation layer can be removed to form an isolation layer opening. The rare earth metal oxide layer can be deposited in the isolation layer opening and on the fin structures. The deposition can be atomic layer deposition (ALD). There can be a post-deposition anneal. The excess rare earth metal oxide layer on the isolation layer and on the fin structures can be polished using chemical-mechanical planarization (CMP). When forming the S/D regions, portions of the fin structures adjacent to the gate structure can be removed by etching. The S/D regions can be epitaxially grown in the removed portions of the fin structures. During the etching of the portions of the fin structures, the rare earth metal oxide layer can protect the top portion of the isolation layer from being removed. If too much of the top portion of the isolation layer is removed, the epitaxially-grown S/D regions can merge together over the isolation layer. The merged S/D regions can increase the complexity of the circuit design and reduce device performance and reliability. Protected isolation layer can prevent the S/D regions from merging together over the isolation layer. Therefore, the rare earth metal oxide layer can reduce circuit complexity and improve device performance and reliability.

Figure 1B:
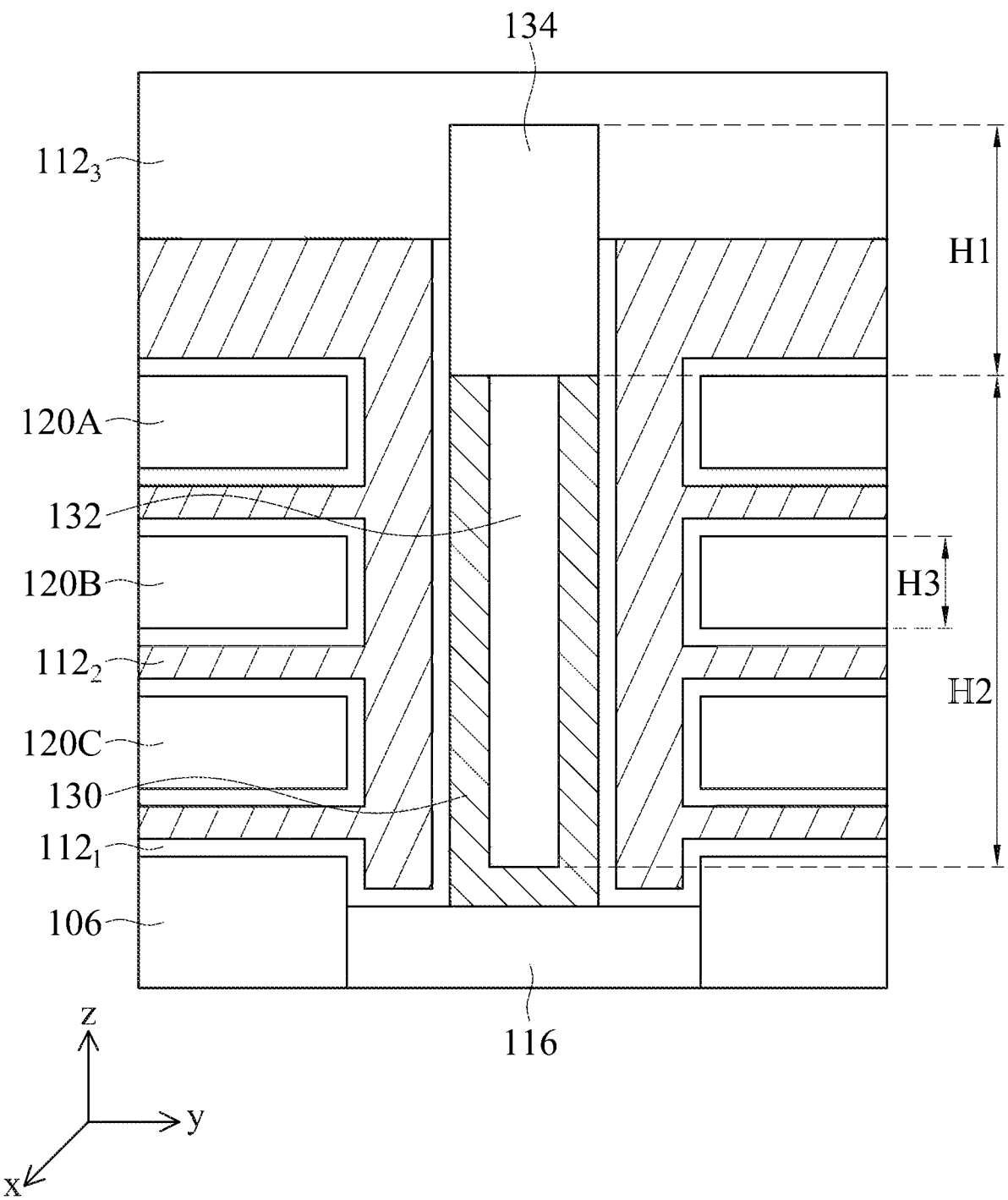
FIGS. 1B-1D illustrate cross-sectional views of a semiconductor device with a rare earth metal oxide layer, in accordance with some embodiments.
Figure 1C:
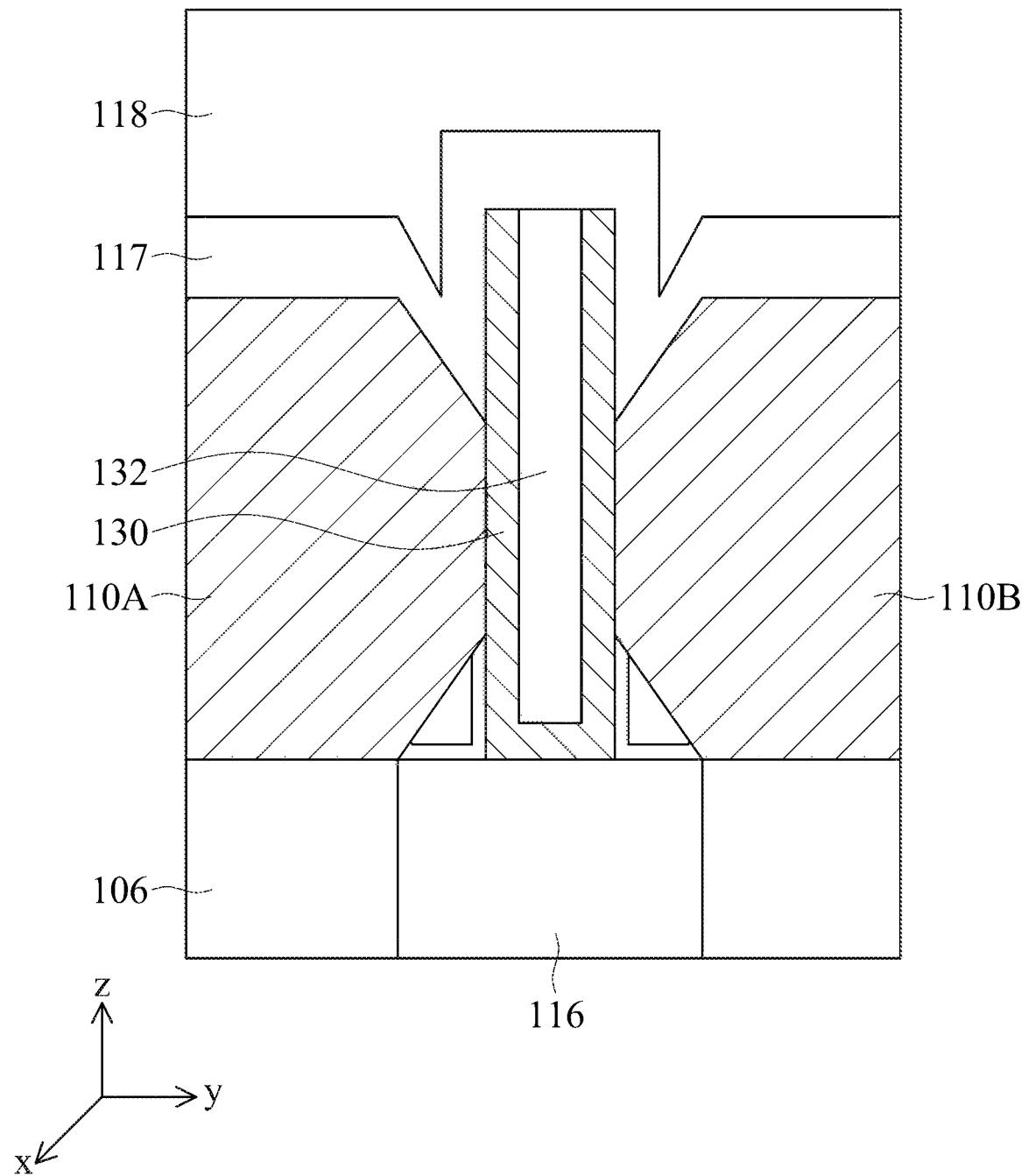
Figure 1D:
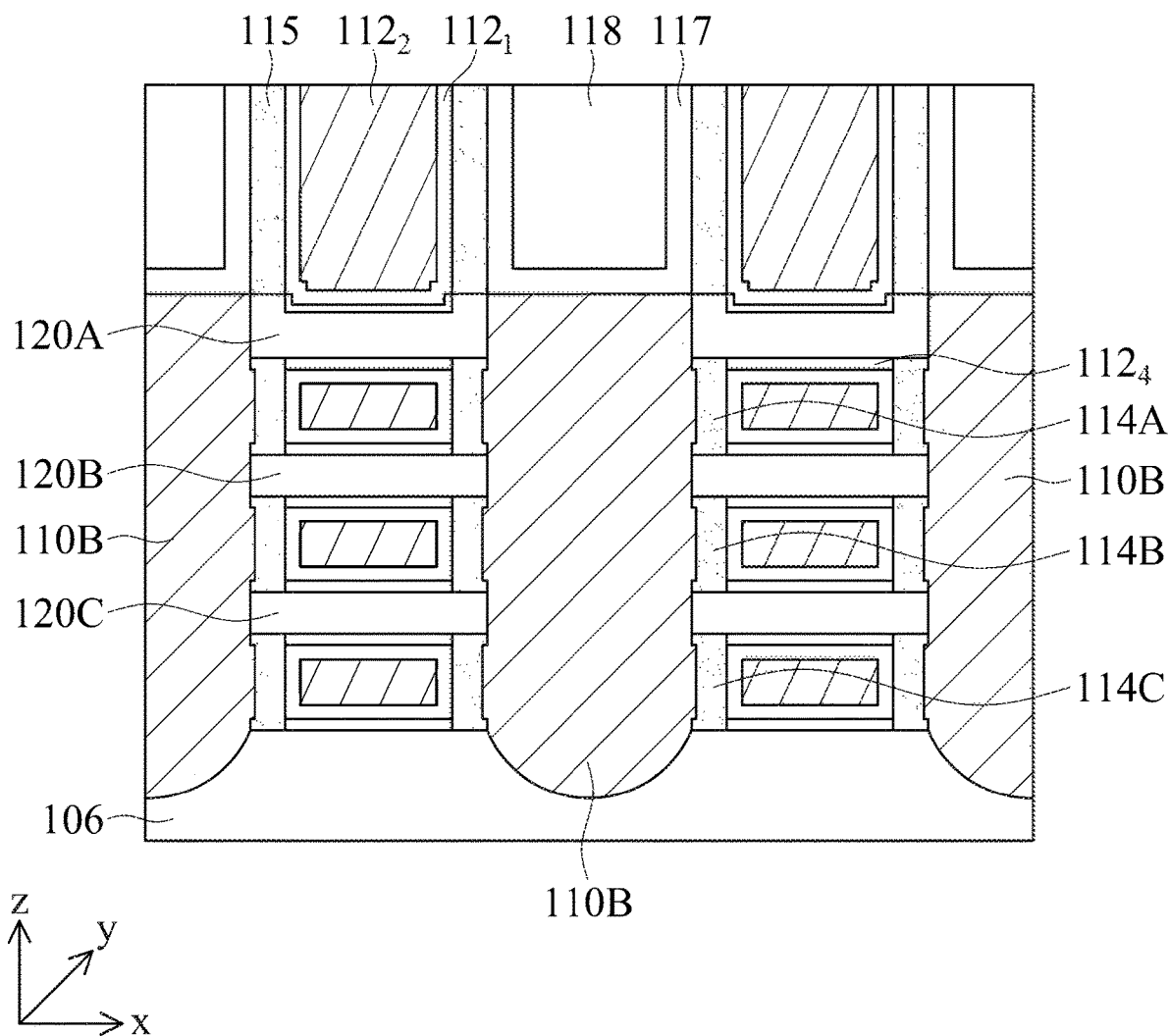

According to some embodiments, FIG. 1A illustrates an isometric view of a FET 100. Though a GAA FET 100 is shown here to represent FET 100, in some embodiments, FET 100 can also represent a finFET 100. In some embodiments, FET 100 can represent n-type FET 100 (NFET 100) and p-type FET 100 (PFET 100) and the discussion of FET 100 applies to both NFET 100 and PFET 100, unless mentioned otherwise. FIG. 1B illustrates a cross-sectional view of FET 100 along line A-A in FIG. 1A showing relative positions between isolation layer 132, liner 130, rare earth metal oxide layer 134, gate structure elements $112_1$-$112_3$, nanostructured channel regions 120A-120C, fin structures 106, and shallow trench isolation (STI) region 116. FIG. 1C illustrates a cross-sectional view of FET 100 along line B-B in FIG. 1A showing relative positions between S/D regions 110A and 110B, isolation layer 132, liner 130, etch stop layer (ESL) 117, interlayer dielectric (ILD) layer 118, fin structures 106, and STI region 116. FIG. 1D illustrates a cross-sectional view of FET 100 along line C-C in FIG. 1A showing relative positions between ESLs 117, ILD layers 118, gate structure elements $112_1$, $112_2$, and $112_4$, nanostructured channel regions 120A-120C, spacers 115, inner spacers 114A-114C, fin structure 106, and S/D regions 110B.

Referring to FIGS. 1A, 1B, and 1D, FET 100 can include gate structures 112 disposed on fin structures 106. Referring to FIGS. 1B and 1D, FET 100 can include gate regions disposed between nanostructured channel regions 120A-120C and on fin structures 106. Referring to FIGS. 1A, 1C, and 1D, FET 100 can include S/D regions 110A and 110B disposed on portions of fin structures 106 that are adjacent to gate structures 112. Referring to FIGS. 1A and 1D, FET 100 can further include gate spacers 115. Referring to FIG. 1D, FET 100 can further include inner spacers 114A-114C. Referring to FIGS. 1A-1C, FET 100 can further include STI regions 116. Referring to FIGS. 1A-1C, FET 100 can further include isolation layers 132 and liners 130. Referring to FIGS. 1A, 1C, and 1D, FET 100 can further include ESLs 117 and ILD layers 118. ILD layers 118 can be disposed on ESLs 117. In some embodiments, gate spacers 115, inner spacers 114A-114C, STI regions 116, isolation layers 132, liners 130, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$).

Referring to FIG. 1A, FET 100 can be formed on a substrate 104. There can be other FETs and/or structures (e.g., isolation structures) formed on substrate 104. Substrate 104 can be a semiconductor material, such as silicon (Si), germanium (Ge), silicon germanium (SiGe), a silicon-on-insulator (SOI) structure, and a combination thereof. Further, substrate 104 can be doped with p-type dopants, such as boron (B), indium (In), aluminum (Al), and gallium (Ga), or n-type dopants, such as phosphorous (P) and arsenic (As). In some embodiments, fin structures 106 can include a material similar to substrate 104 and extend along an X-axis.

Referring to FIGS. 1B and 1D, in some embodiments, FET 100 can include nanostructured channel regions 120A-120C. Nanostructured channel regions 120A-120C can include a semiconductor material, similar to or different from substrate 104. Nanostructured channel regions 120A-120C can include a semiconductor material, similar to fin structures 106 and S/D regions 110A and 110B. In some embodiments, nanostructured channel regions 120A-120C can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, and other suitable semiconductor materials. Nanostructured channel regions 120A-120C can be nanosheets and nanowires. Nanostructured channel regions 120A-120C can have cross-sections of other geometric shapes, such as circular, elliptical, triangular, and polygonal shapes.

Referring to FIGS. 1A-1B and 1D, in some embodiments, gate structures 112 can be multi-layered structures. For FET 100, the gate regions disposed between the nanostructured channel regions can also be multi-layered structures. Each of gate structures 112 and the gate regions can include an interfacial oxide (10) layer $112_4$, a high-k (HK) gate dielectric layer $112_1$ disposed on IO layer $112_4$, and a conductive layer disposed on HK gate dielectric layer $112_1$. IO layers $112_4$ can include $SiO_x$, $SiGeO_x$, and germanium oxide ($GeO_x$). HK gate dielectric layers $112_1$ can include a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The conductive layers can be multi-layered structures. Each of the conductive layers can include a work function metal (WFM) layer $112_2$ disposed on HK gate dielectric layer $112_1$, and a gate metal fill layer 1123 disposed on WFM layer $112_2$. In some embodiments, WFM layers $112_2$ can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, and a combination thereof. In some embodiments, WFM layers $112_2$ can include substantially Al-free (e.g., with no Al) Ti-based and Ta-based nitrides and alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. Gate metal fill layers 1123 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A, 1C, and 1D, for NFET 100, each of S/D regions 110A and 110B can include an epitaxially grown semiconductor material, such as Si and SiGe, and n-type dopants, such as P and other suitable n-type dopants. For PFET 100, each of S/D regions 110A and 110B can include an epitaxially grown semiconductor material, such as Si and SiGe, and p-type dopants, such as B and other suitable p-type dopants. A dopant concentration can be in a range from about $1\times10^{20}$ atoms/cm$^3$ to about $3\times10^{22}$ atoms/cm$^3$ in each of S/D regions 110A and 110B. In some embodiments, S/D regions 110A and 110B can have a depth of about 50 nm to about 70 nm.

Referring to FIGS. 1A and 1B, FET 100 can further include rare earth metal oxide layers 134. If rare earth metal oxide layers 134 are formed by implanting rare earth metal atoms into isolation layers 132 and liners 130, rare earth metal oxide layers 134 can include a composition of $M_xSi_yO_z$, where (i) element M can be a rare earth metal, such as hafnium (Hf), lanthanum (La), indium (In), rhodium (Rh), palladium (Pd), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and combinations thereof; (ii) x can be a value between about 0 and about 2, (iii) y can be a value between about 0 and about 1, and (iv) z can be a value between about 1 and about 4. In some embodiments, rare earth metal oxide layers 134 can include carbon (C) and nitrogen (N). The concentration of the rare earth metal atoms in rare earth metal oxide layers 134 can vary with respect to depth. In some embodiments, the concentration can decrease from the top surface of rare earth metal oxide layers 134 to the bottom surface of rare earth metal oxide layers 134. In some embodiments, the concentration can increase first and then decrease from the top surface of rare earth metal oxide layers 134 to the bottom surface of rare earth metal oxide layers 134. The concentration of the rare earth metal atoms in rare earth metal oxide layers 134 can range from about $1\times10^{20}$ atoms/cm$^3$ to about $3\times10^{22}$ atoms/cm$^3$. If the concentration is smaller than about $1\times10^{20}$ atoms/cm$^3$, rare earth metal oxide layers 134 cannot protect isolation layers 132 from etching during S/D region formation. If the concentration is greater than about $3\times10^{22}$ atoms/cm$^3$, the cost to form rare earth metal oxide layers 134 can be too high.

If rare earth metal oxide layers 134 are formed by implanting rare earth metal atoms into isolation layers 132 and liners 130, a thickness H1 of rare earth metal oxide layers 134 can be between about 1 nm and about 10 nm, between about 0.8 nm and about 12 nm, and between about 0.5 nm and about 15 nm. If H1 is smaller than about 0.5 nm, rare earth metal oxide layers 134 cannot protect isolation layers 132 from etching during S/D region formation. If H1 is greater than about 15 nm, the cost to form rare earth metal oxide layers 134 can be too high. A thickness H2 of isolation layers 132 can be between about 50 nm and about 100 nm. A ratio between H1 and H2 can be between about 0.02 and about 0.2, between about 0.015 and about 0.25, and between about 0.01 and about 0.3. If H1/H2 is smaller than about 0.01, rare earth metal oxide layers 134 cannot protect isolation layers 132 from etching during S/D region formation. If H1/H2 is greater than about 0.3, the cost to form rare earth metal oxide layers 134 can be too high. Referring to FIG. 1B, a thickness H3 of nanostructured channel regions 120A-120C can be between about 1 nm and about 25 nm. A ratio between H1 and H3 can be between about 0.2 and about 2, between about 0.15 and about 2.5, and between about 0.1 and about 3. If H1/H3 is smaller than about 0.1, rare earth metal oxide layers 134 cannot protect isolation layers 132 from etching during S/D region formation. If H1/H3 is greater than about 3, the cost to form rare earth metal oxide layers 134 can be too high.

Referring to FIGS. 1A and 1B, if rare earth metal oxide layers 134 are formed by removing the top portions of isolation layers 132 to form isolation layer openings and filling the isolation layer openings by an ALD process, rare earth metal oxide layers 134 can include a composition of $M_xO_y$, where (i) element M can be a rare earth metal, such as Hf, La, In, Rh, Pd, In, Ce, Pr, Nd, Pm, Sm, Eu, Gd, Tb, Dy, Ho, Er, Tm, Yb, Lu, and combinations thereof, (ii) x can be a value between about 0 and about 2, and (iii) y can be a value between about 0 and about 3. The concentration of the rare earth metal atoms in rare earth metal oxide layers 134 can be substantially uniform. The concentration of the rare earth metal atoms in rare earth metal oxide layers 134 can range from about $1\times10^{20}$ atoms/cm$^3$ to about $3\times10^{22}$ atoms/cm$^3$. If the concentration is smaller than about $1\times10^{20}$ atoms/cm$^3$, rare earth metal oxide layers 134 cannot protect isolation layers 132 from etching during S/D region formation. If the concentration is greater than about $3\times10^{22}$ atoms/cm$^3$, the cost to form rare earth metal oxide layers 134 can be too high.

If rare earth metal oxide layers 134 are formed by removing the top portions of isolation layers 132 to form isolation layer openings and filling the isolation layer openings by an ALD process, a thickness H1 of rare earth metal oxide layers 134 can be between about 3 nm and about 10 nm, between about 2 nm and about 15 nm, and between about 1 nm and about 20 nm. If H1 is smaller than about 1 nm, rare earth metal oxide layers 134 cannot protect isolation layers 132 from etching during S/D region formation. If H1 is greater than about 20 nm, the cost to form rare earth metal oxide layers 134 can be too high. A thickness H2 of isolation layers 132 can be between about 50 nm and about 100 nm. A ratio between H1 and H2 can be between about 0.06 and about 0.2, between about 0.05 and about 0.25, and between about 0.04 and about 0.3. If H1/H2 is smaller than about 0.04, rare earth metal oxide layers 134 cannot protect isolation layers 132 from etching during S/D region formation. If H1/H2 is greater than about 0.3, the cost to form rare earth metal oxide layers 134 can be too high. Referring to FIG. 1B, a thickness H3 of nanostructured channel regions 120A-120C can be between about 1 nm and about 25 nm. A ratio between H1 and H3 can be between about 0.6 and about 2, between about 0.5 and about 2.5, and between about 0.4 and about 3. If H1/H3 is smaller than about 0.4, rare earth metal oxide layers 134 cannot protect isolation layers 132 from etching during S/D region formation. If H1/H3 is greater than about 3, the cost to form rare earth metal oxide layers 134 can be too high.

Figure 2A:
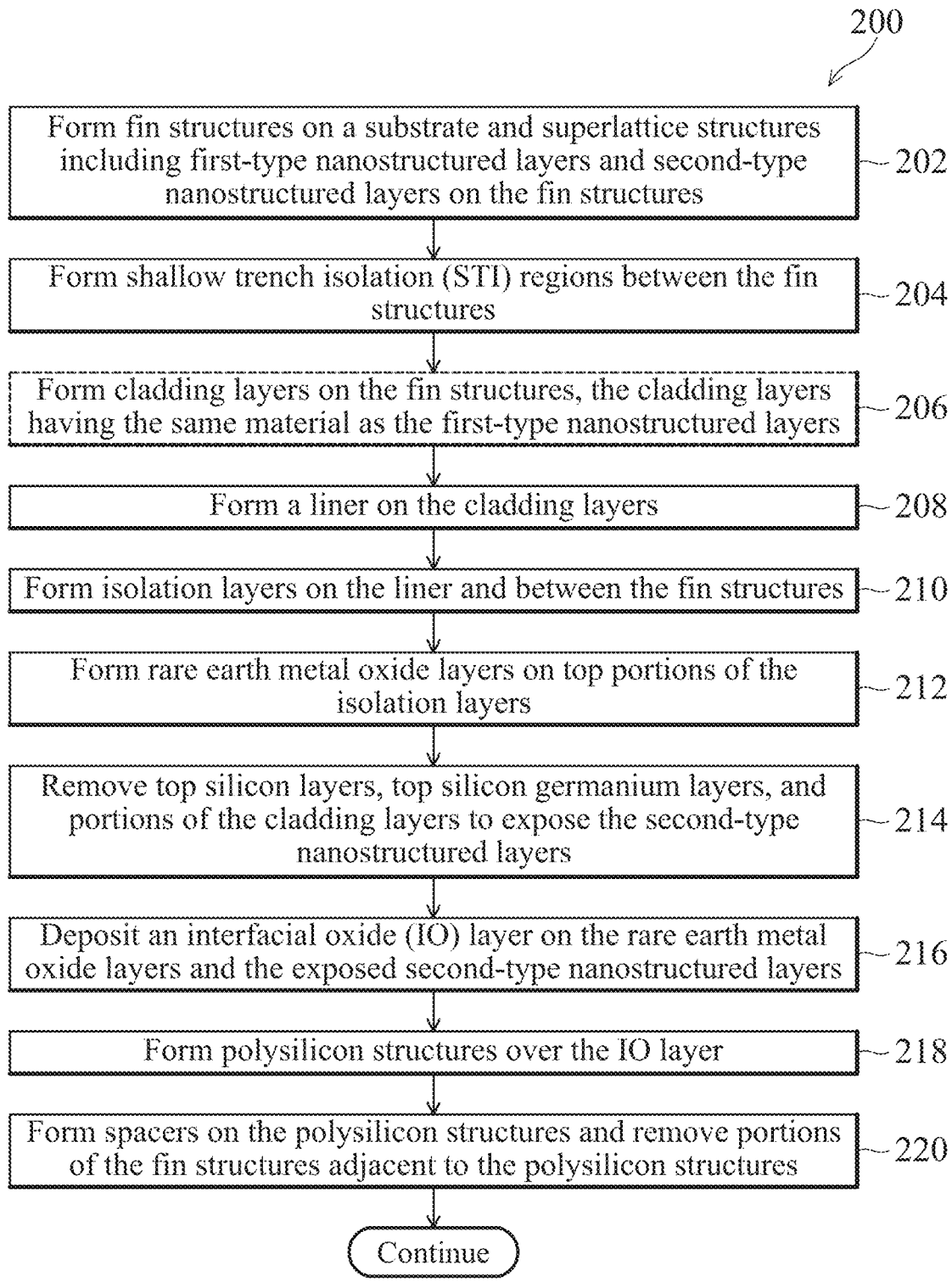
FIGS. 2A and 2B are flow diagrams of a method for fabricating a semiconductor device with a rare earth metal oxide layer, in accordance with some embodiments.
Figure 2B:
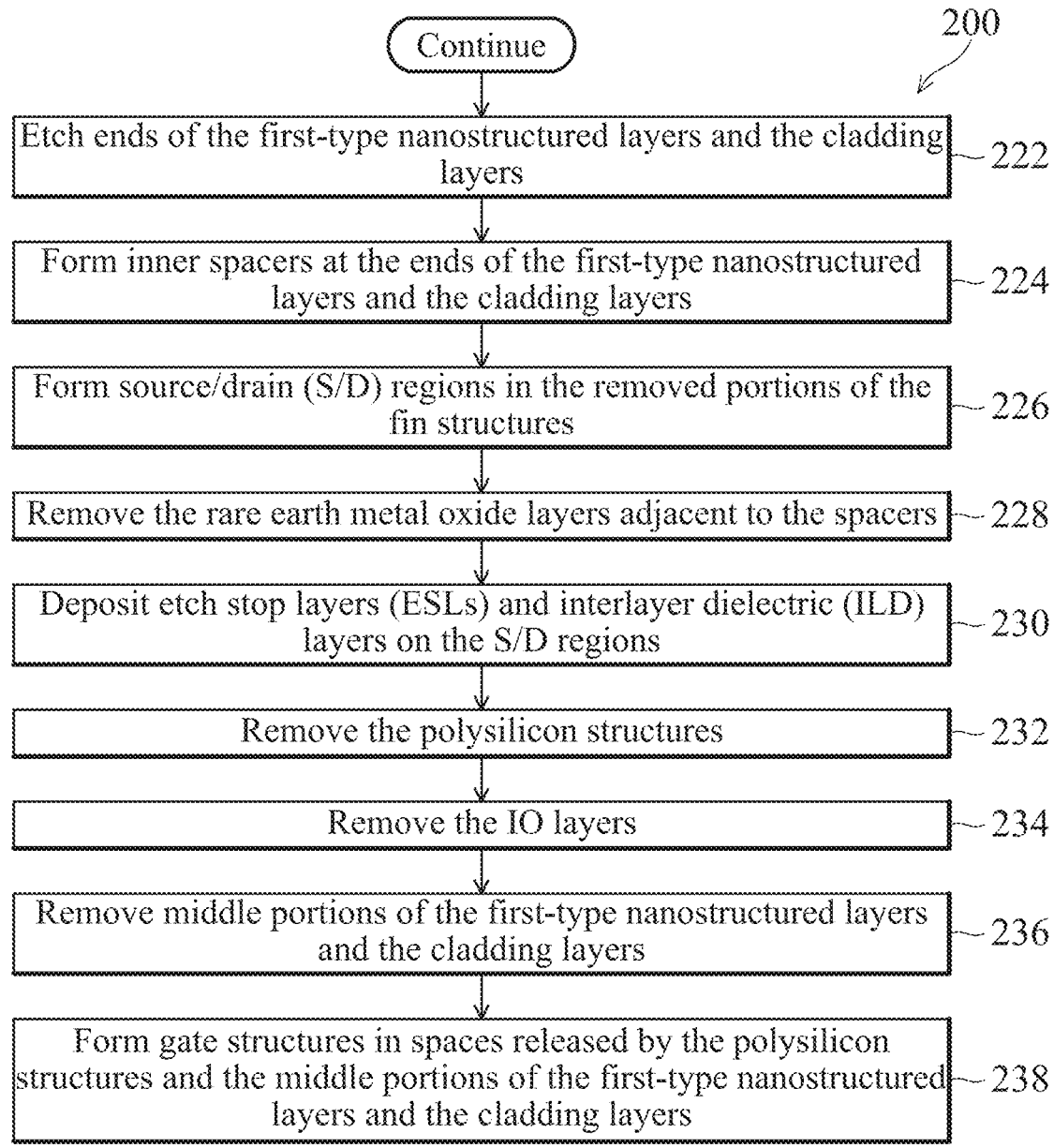

According to some embodiments, FIGS. 2A and 2B are flow diagrams describing a method 200 for fabricating FET 100, as shown in FIGS. 1A-1D. For illustrative purposes, the operations illustrated in FIGS. 2A and 2B will be described with reference to the example fabrication process for fabricating FET 100 as illustrated in FIGS. 3-7, 8A-8E, 9-16, 17A-17B, and 18-20. FIGS. 3-8A and 8D-17A are isometric views of FET 100 at various stages of fabrication, according to some embodiments. FIGS. 17B-20 are isometric views of FET 100 at various stages of fabrication viewed from line D-D in FIG. 17A for ease of description of the structures hidden in FIG. 17A, according to some embodiments. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIGS. 2A and 2B. It should be noted that method 200 may not produce a complete FET 100. Accordingly, it is understood that additional processes can be provided before, during, and after method 200, and that some other processes may only be briefly described herein. Elements in FIGS. 3-8A, 8D-8E, 9-16, 17A-17B, and 18-20 with the same annotations as elements in FIGS. 1A-1D are described above. Even though method 200 is described with respect to FET 100, method 200 can be performed to fabricate finFET 100.

Figure 3:
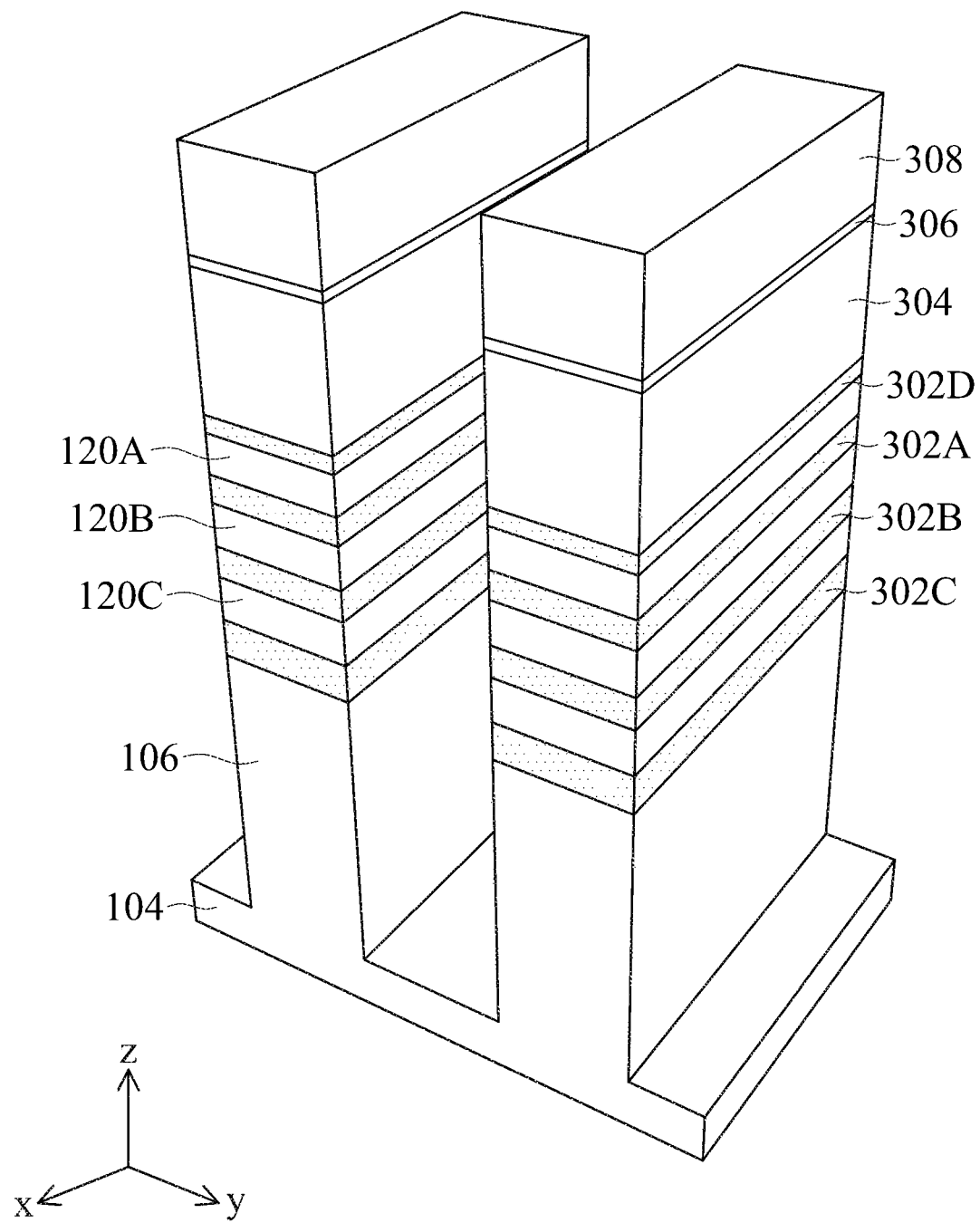

Referring to FIG. 2A, in operation 202, fin structures are formed on a substrate. For example, as shown in FIG. 3, fin structures 106 are formed on substrate 104. A superlattice structure including first-type nanostructured layers 302A-302C and second-type nanostructured layers 120A-120C can be formed on each of fin structures 106. First-type nanostructured layers 302A-302C can be single crystal SiGe epitaxially grown on fin structures 106. Second-type nanostructured layers 120A-120C can be single crystal Si epitaxially grown on fin structures 106 and interposed between first-type nanostructured layers 302A-302C. Second-type nanostructured layers 120A-120C can function as the nanostructured channel regions in FET 100. A top SiGe layer 302D, a top Si layer 304, a $SiO_x$ capping layer 306, and a SiN capping layer 308 can be formed on the superlattice structure to act as masking layers and/or ESLs, described below. Fin structures 106 can be patterned by any suitable method.

Figure 4:
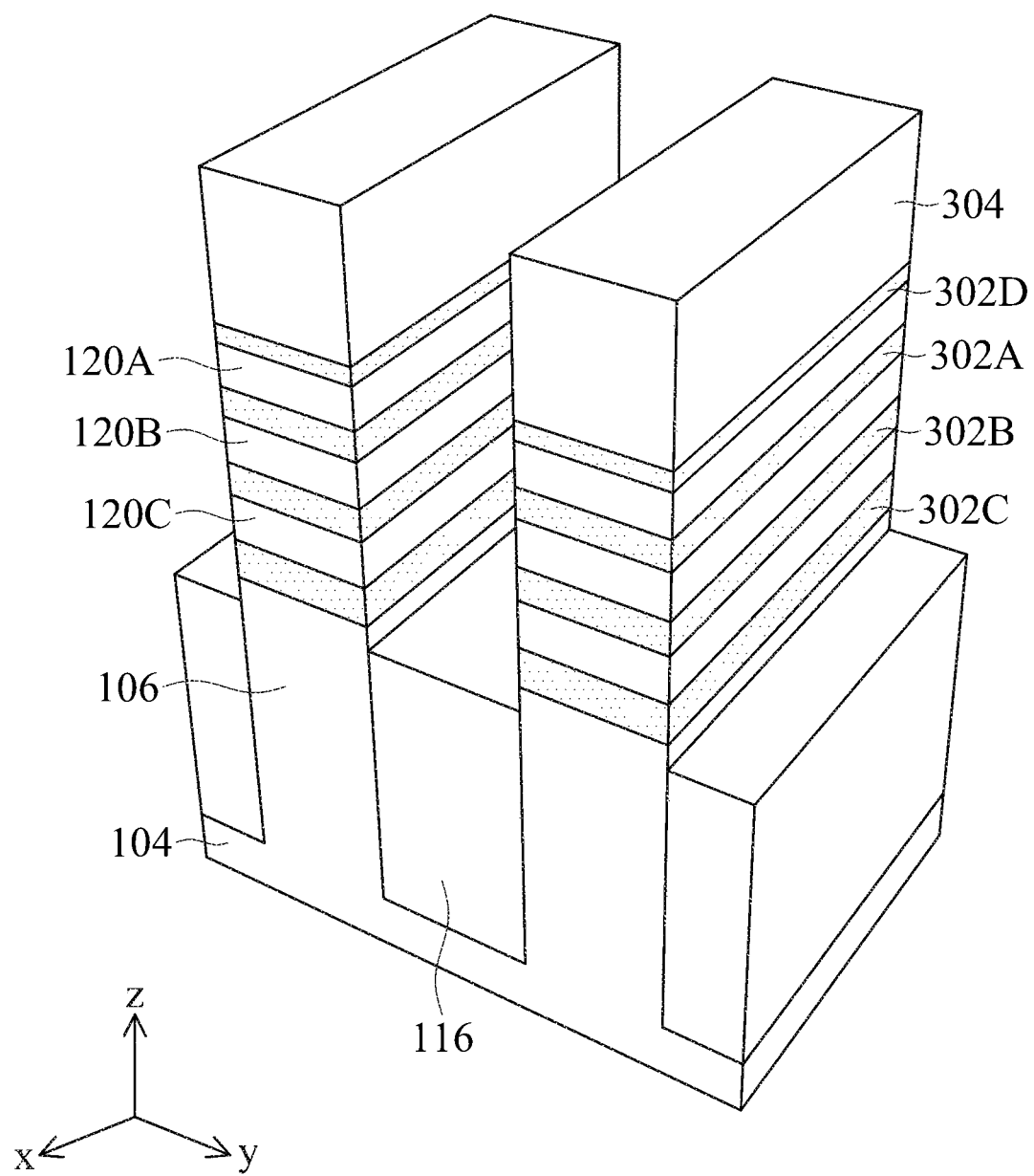

Referring to FIG. 2A, in operation 204, STI regions are formed between the fin structures. For example, as shown in FIG. 4, STI regions 116 are formed between fin structures 106. A STI layer can be blanket deposited using chemical vapor deposition (CVD), physical vapor deposition (PVD), and plasma-enhanced chemical vapor deposition (PECVD). In some embodiments, a post-deposition anneal process can be performed. In some embodiments, a chemical mechanical polishing/planarization (CMP) process can follow the deposition of the STI layer, such that the STI layer is substantially coplanar with SiN capping layer 308. Portions of the STI layer can be removed and recessed by dry etching (e.g., reactive ion etching process) and wet etching to form STI regions 116. SiN capping layer 308 and $SiO_x$ capping layer 306 can function as ESLs and can be removed in the STI recessing process.

Figure 5:
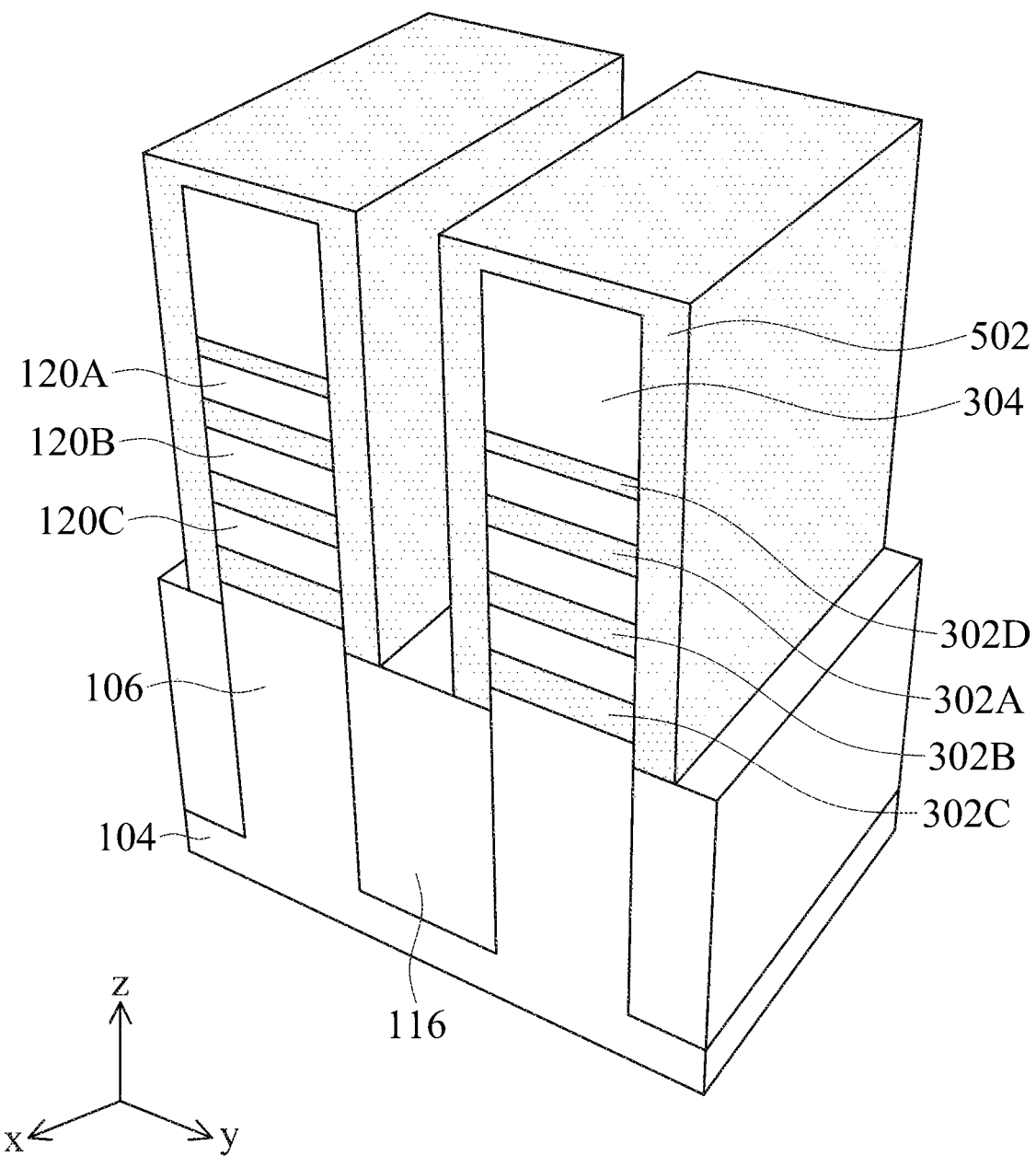

Referring to FIG. 2A, in operation 206, cladding layers are formed on the fin structures. For example, as shown in FIG. 5, cladding layers 502 are formed on fin structures 106. Cladding layers 502 can have the same material as first-type nanostructured layers 302A-302C, such as SiGe. Cladding layers 502 can be amorphous. Cladding layers 502 can be deposited using a CVD process with germane ($GeH_4$) and disilane ($Si_2H_6$) as precursors. A dry etch can be performed to remove cladding layers 502 on STI regions 116.

Figure 6:
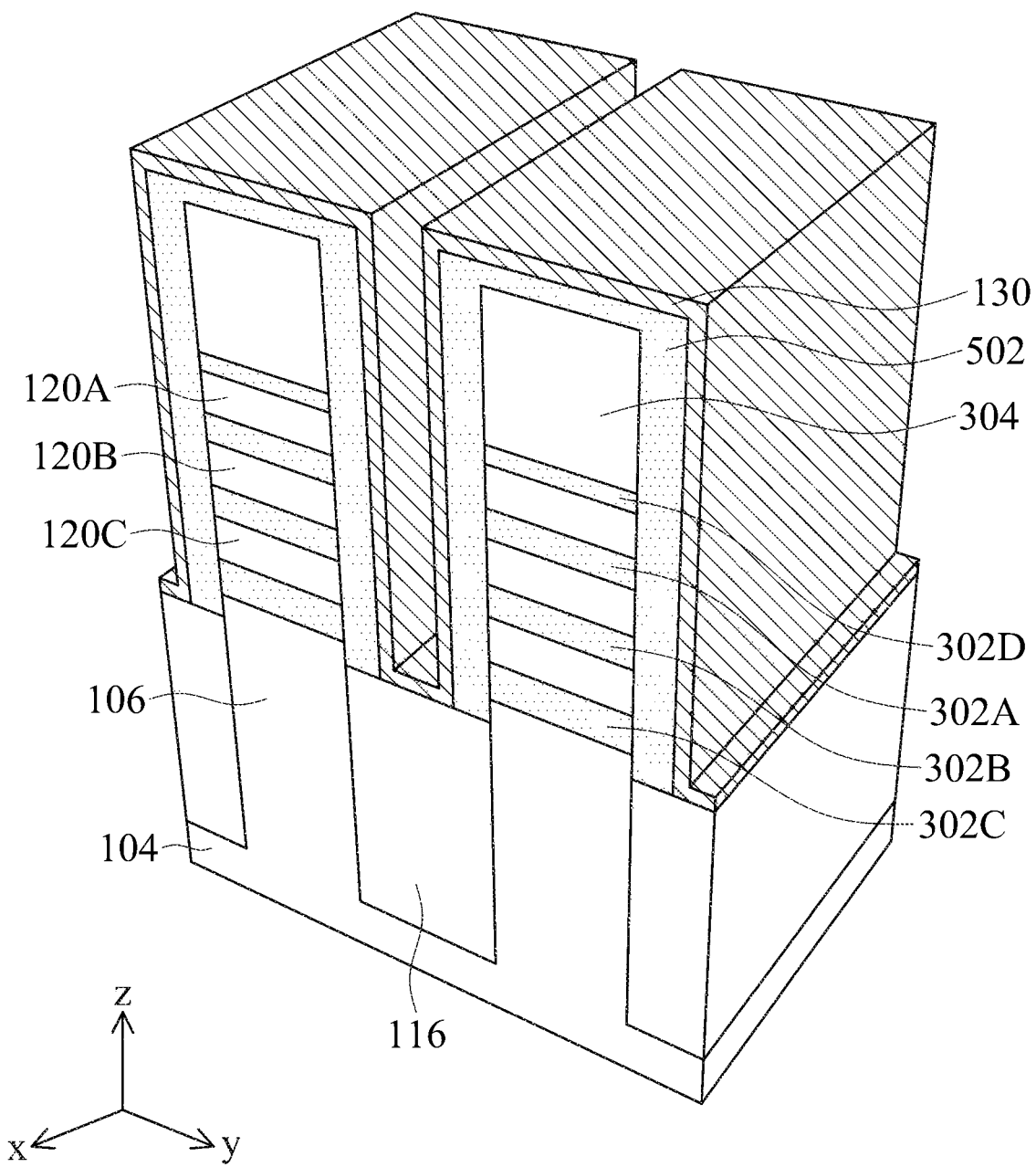

Referring to FIG. 2A, in operation 208, a liner is formed on the cladding layers. For example, as shown in FIG. 6, liner 130 is formed on cladding layers 502. Liner 130 can be a low-k dielectric material, such as a dielectric material with a dielectric constant lower than 3.9. Liner 130 can be deposited using CVD, PVD, and PECVD.

Figure 7:
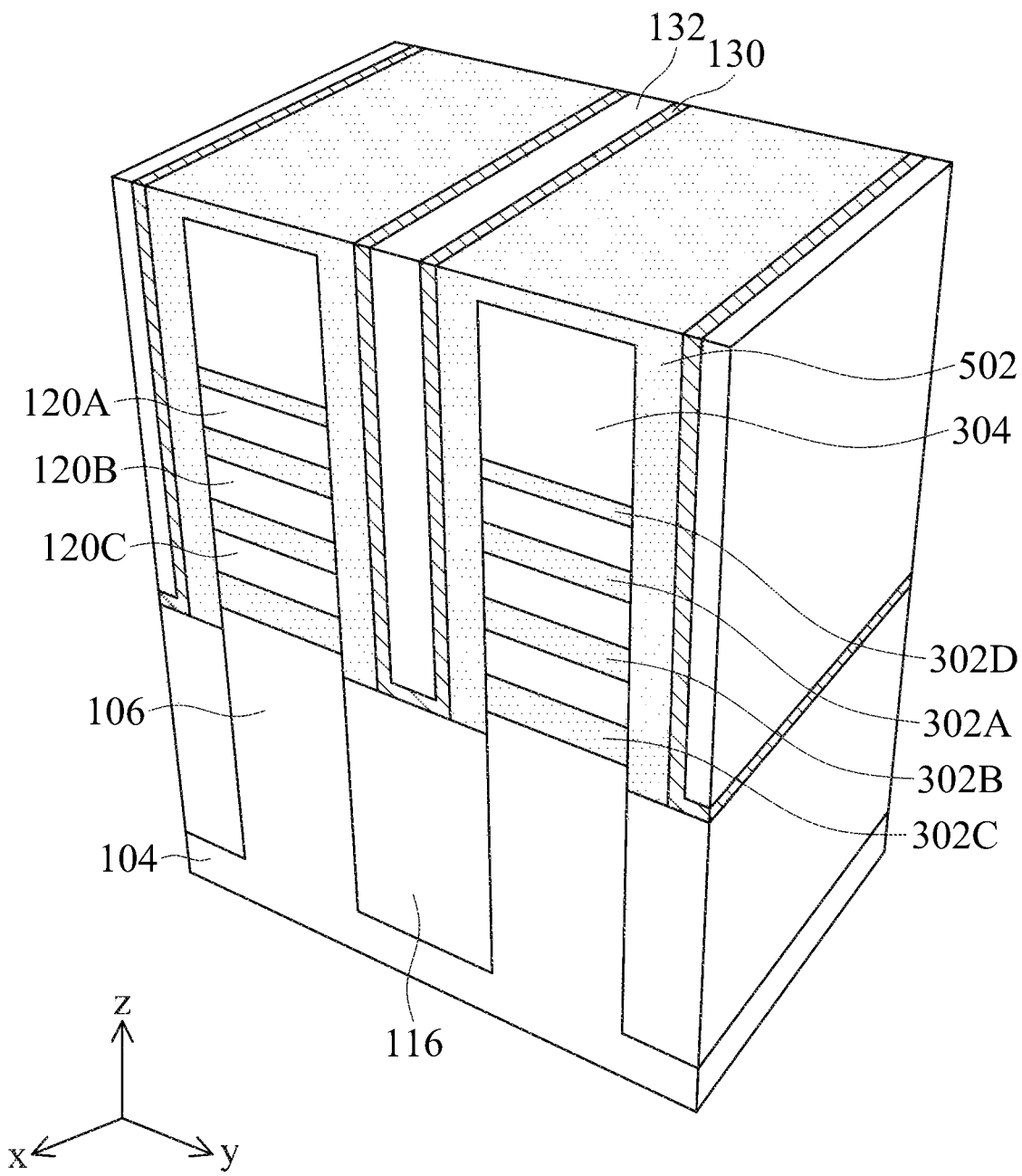

Referring to FIG. 2A, in operation 210, isolation layers are formed on the liner and between the fin structures. For example, as shown in FIG. 7, isolation layers 132 are formed on liner 130 and between fin structures 106. Isolation layers 132 can be an insulating material and can be deposited using CVD, PVD, and PECVD. In some embodiments, a post-deposition anneal process can be performed. In some embodiments, a CMP process can follow the deposition of isolation layers 132, such that isolation layers 132 and liners 130 are substantially coplanar with cladding layers 502.

Referring to FIG. 2A, in operation 212, rare earth metal oxide layers are formed on the top portions of the isolation layers. In some embodiments, the rare earth metal oxide layers can be formed by rare earth metal implantation into the isolation layers. For example, rare earth metal implantation can be performed on top portions of isolation layers 132, liners 130, cladding layers 502, and top Si layers 304 of FIG. 7 to form the implanted rare earth metal oxide layer 134 of FIG. 8A.

In some embodiments, the rare earth metal oxide layers can be formed by removing the top portions of isolation layers 132 to form isolation layer openings and filling the isolation layer openings by an ALD process. For example, as shown in FIG. 8D, the top portions of isolation layers 132 and liners 130 are removed to form isolation layer openings 802, and as shown in FIG. 8E, rare earth metal oxide layers 134 are formed in isolation layer openings 802.

Figure 8A:
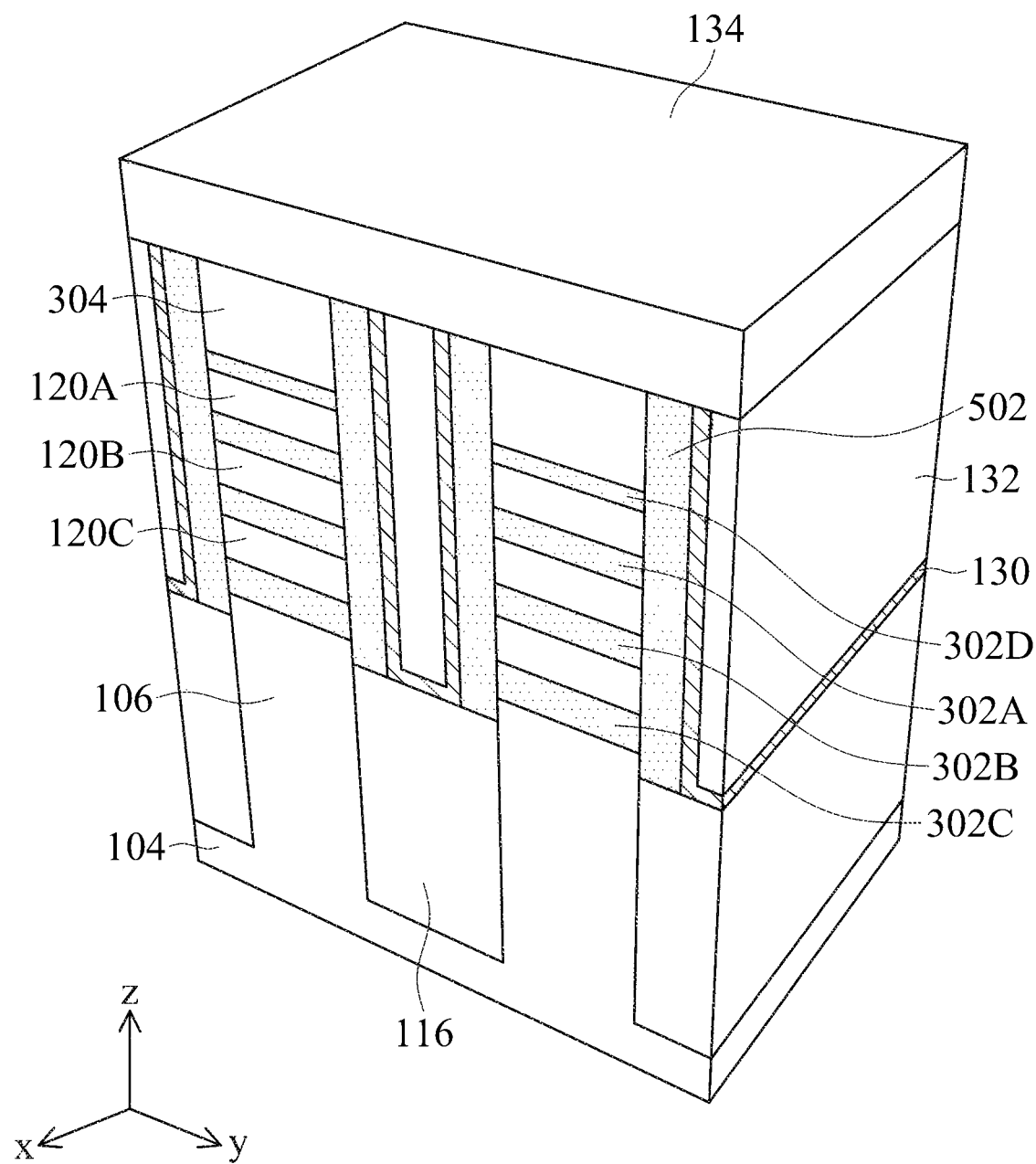

Referring to FIG. 8A, rare earth metal implantation is performed on isolation layers 132, liners 130, cladding layers 502, and top Si layers 304. Implantation dopant species can be a rare earth metal, such as Hf, La, In, Rh, Pd, In, Ce, Pr, Nd, Pm, Sm, Eu, Gd, Tb, Dy, Ho, Er, Tm, Yb, Lu, and combinations thereof. The ion beam energy can be between about 1 keV and about 10 keV, between about 0.8 keV and about 12 keV, and between about 0.5 keV and about 15 keV. If the ion beam energy is smaller than about 0.5 keV, the depth of rare earth metal implantation can be too small and rare earth metal oxide layers 134 cannot protect isolation layers 132 from etching during S/D region formation. If the ion beam energy is greater than about 15 keV, the rare earth metal implantation can introduce too many defects and damages to isolation layers 132. The dose of the rare earth metal atoms can be between about $1\times10^{15}$ ions/cm$^2$ and about $1\times10^{16}$ ions/cm$^2$, between about $0.8\times10^{15}$ ions/cm$^2$ and about $1.2\times10^{16}$ ions/cm$^2$, and between about $0.5\times10^{15}$ ions/cm$^2$ and about $1.5\times10^{16}$ ions/cm$^2$. If the dose is smaller than about $0.5\times10^{15}$ ions/cm$^2$, the concentration of rare earth metal atoms in rare earth metal oxide layers 134 can be too small and rare earth metal oxide layers 134 cannot protect isolation layers 132 from etching during S/D region formation. If the dose is greater than about $1.5\times10^{16}$ ions/cm$^2$, the cost to form rare earth metal oxide layers 134 can be too high. The tilt angle for the ion beam can be between about 7° and about 30°. The twist angle for the ion beam can be flexible. In some embodiments, a post-implantation anneal can be performed. The post-implantation anneal temperature can be between about 600° C. and about 1000° C. The duration of the post-implantation anneal can be between about 1 second and about 300 seconds. The post-implantation anneal can be performed in an oxygen ($O_2$) and nitrogen ($N_2$) atmosphere.

Figure 8C:
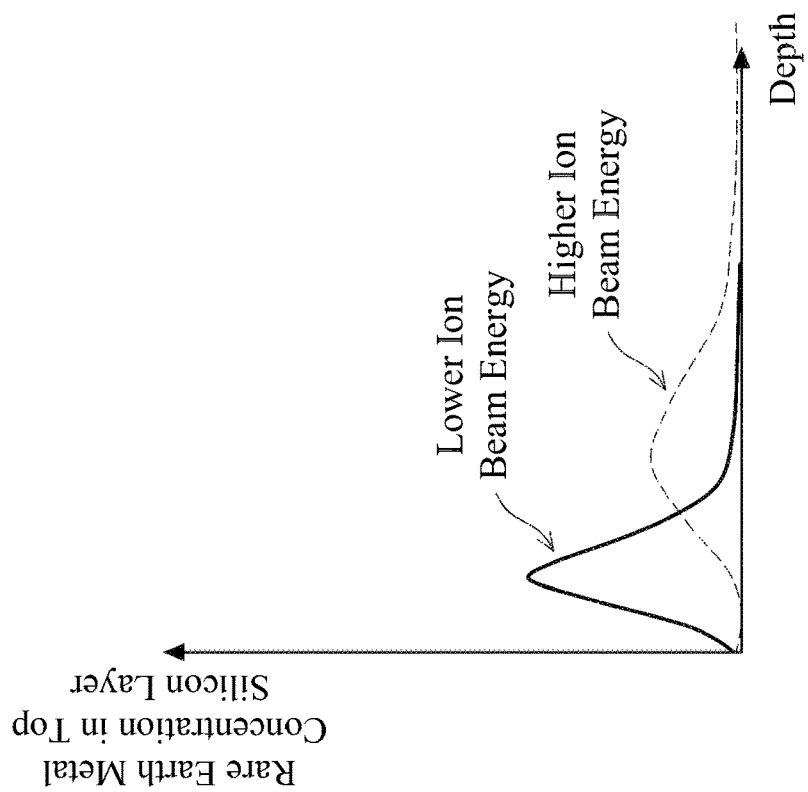
Figure 8B:
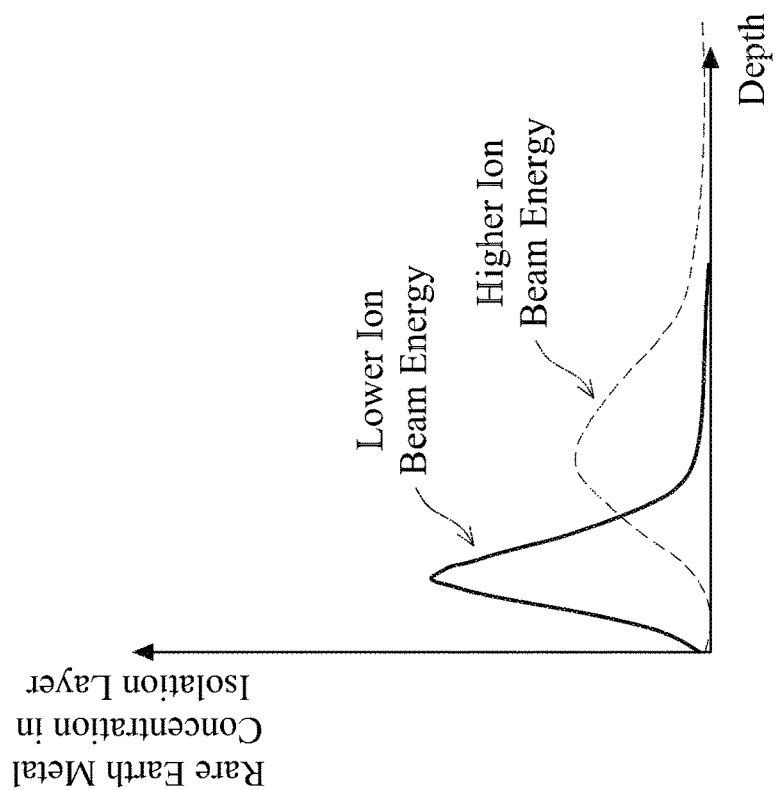

Referring to FIG. 8B, the concentration of the rare earth metal atoms implanted in isolation layers 132 and liners 130 can increase with depth first and then decrease. The most concentrated point with respect to depth can be shallower with lower ion beam energy and can be deeper with higher ion beam energy. The concentration of the rare earth metal atoms implanted at the most concentrated point is greater with lower ion beam energy and smaller with higher ion beam energy. The entire depth of implantation can be smaller with lower ion beam energy and greater with higher ion beam energy. In some embodiments, the concentration of the rare earth metal atoms implanted in isolation layers 132 and liners 130 can decrease with depth from the top surface of isolation layers 132 and liners 130. Referring to FIG. 8C, the concentration of the rare earth metal atoms implanted in top Si layers 304 can change with respect to depth and ion beam energy in a manner similar to the concentration change described with reference to FIG. 8B. The concentration of the rare earth metal atoms implanted at the most concentrated point is greater in isolation layers 132 and liners 130 and smaller in top Si layers 304.

Figure 8D:
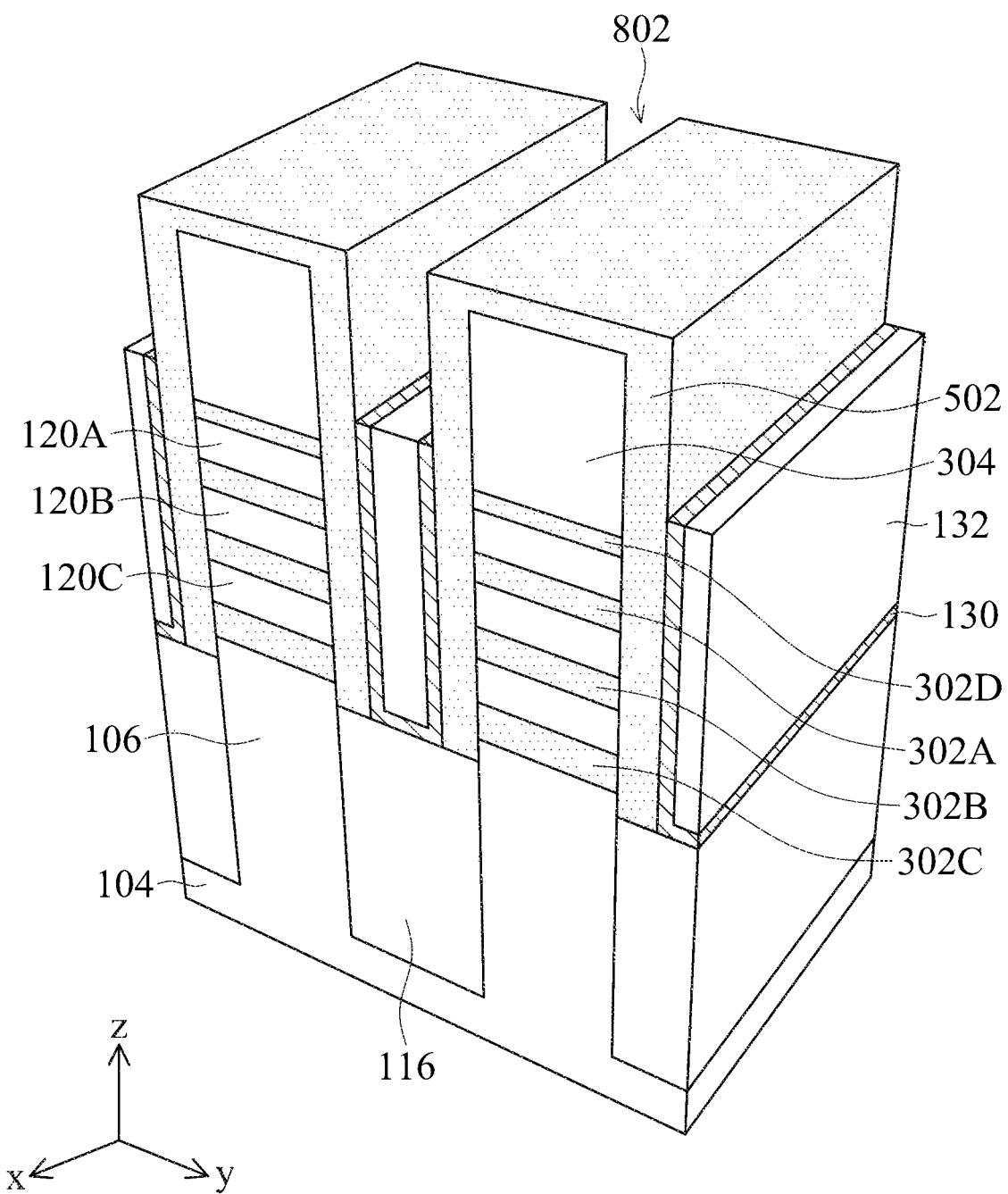
Figure 8E:
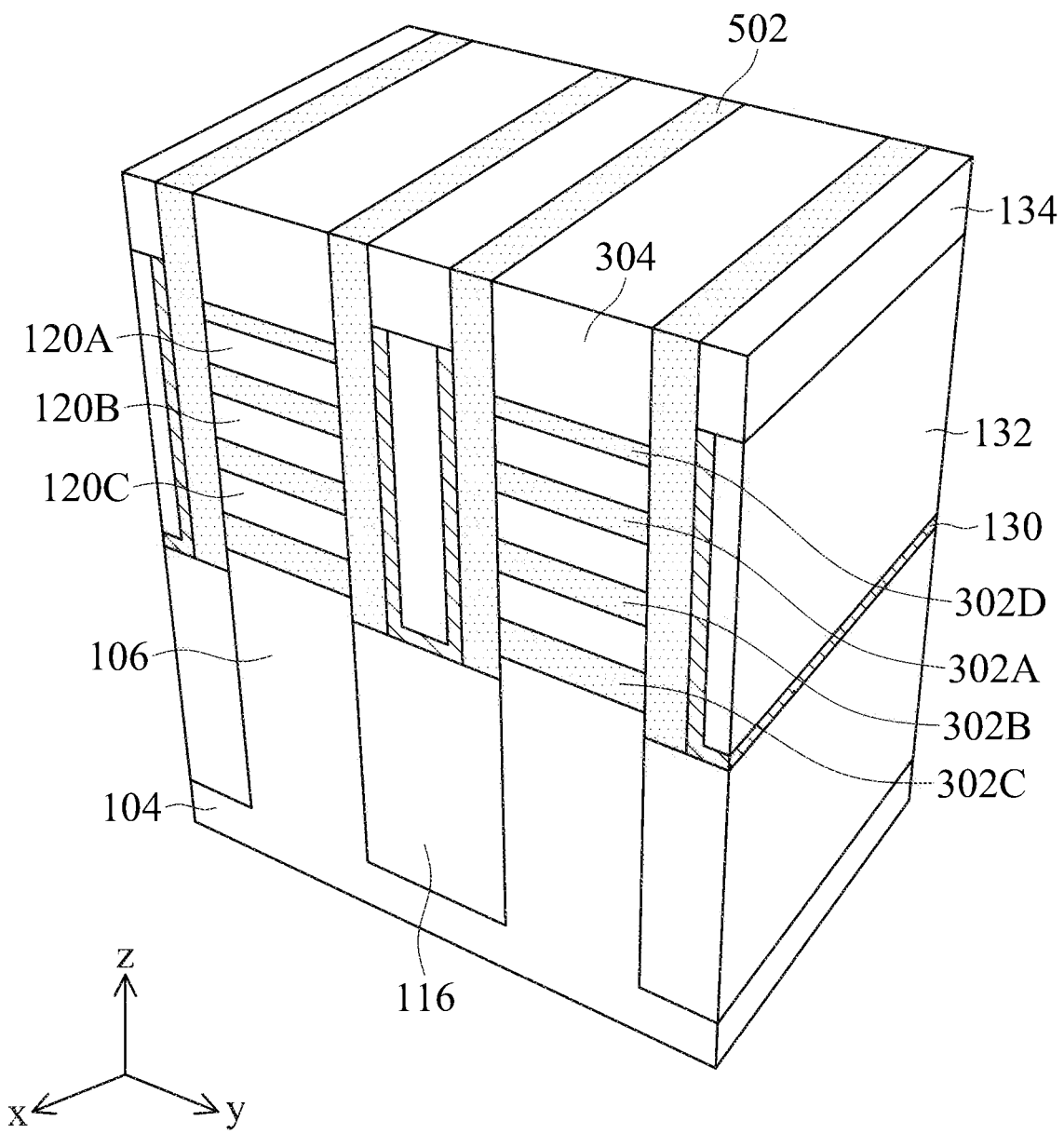

Referring to FIGS. 8D and 8E, the top portions of isolation layers 132 and liners 130 are removed to form isolation layer openings 802, and rare earth metal oxide layers 134 are formed in isolation layer openings 802. Referring to FIG. 8D, the top portions of isolation layers 132 and liners 130 can be removed by dry etching (e.g., reactive ion etching process) and isolation layer openings 802 can be formed. Referring to FIG. 8E, rare earth metal oxide layers 134 can be deposited in isolation layer openings 802. In some embodiments, rare earth metal oxide layers 134 can be deposited by an ALD process. By way of example and not limitation, the deposited rare earth metal oxide layers 134 can include terbium oxide ($Tb_2O_3$). A precursor gas terbium tris(isopropylcyclopentadienyl) ($Tb(iPrCp)_3$) can be used in the ALD process. The precursor gas $Tb(iPrCp)_3$ can be supplied between about 3 seconds and about 5 seconds, between about 2 seconds and about 7 seconds, and between about 1 second and about 10 seconds. If the duration of the precursor gas $Tb(iPrCp)_3$ is smaller than about 1 second, the concentration of the rare earth metal atoms in rare earth metal oxide layers 134 can be too small and rare earth metal oxide layers 134 cannot protect isolation layers 132 from etching during S/D region formation. If the duration of the precursor gas $Tb(iPrCp)_3$ is greater than about 10 seconds, the cost to form rare earth metal oxide layers 134 can be too high.

A first argon (Ar) gas can be supplied following the precursor gas $Tb(iPrCp)_3$ and the duration of the first Ar gas can be between about 10 seconds and about 30 seconds. Ozone ($O_3$) gas can be supplied following the first Ar gas and the duration of the $O_3$ gas) can be between about 1 second and about 5 seconds. A second Ar gas can be supplied following the $O_3$ gas) and the duration of the second Ar gas can be between about 10 seconds and about 30 seconds. To form rare earth metal oxide layers 134 including other rare earth metals than Tb, other suitable precursor gases can be used. Other suitable precursor gases can include a rare earth metal, such as Hf, La, In, Rh, Pd, In, Ce, Pr, Nd, Pm, Sm, Eu, Gd, Dy, Ho, Er, Tm, Yb, Lu, and combinations thereof. The growth temperature of the deposited rare earth metal oxide layers 134 can be between about 100° C. and about 400° C. In some embodiments, a CMP process can follow the deposition of rare earth metal oxide layers 134 in isolation layer openings 802, such that the top portions of cladding layers 502 are removed, and rare earth metal oxide layers 134, cladding layers 502, and top Si layers 304 are substantially coplanar with each other. In some embodiments, a post-deposition anneal can be performed. The post-deposition anneal temperature can be between about 600° C. and about 1000° C. The duration of the post-deposition anneal can be between about 1 second and about 1800 seconds. The post-deposition anneal can be performed in an $O_2$ and $N_2$ atmosphere.

Figure 9:
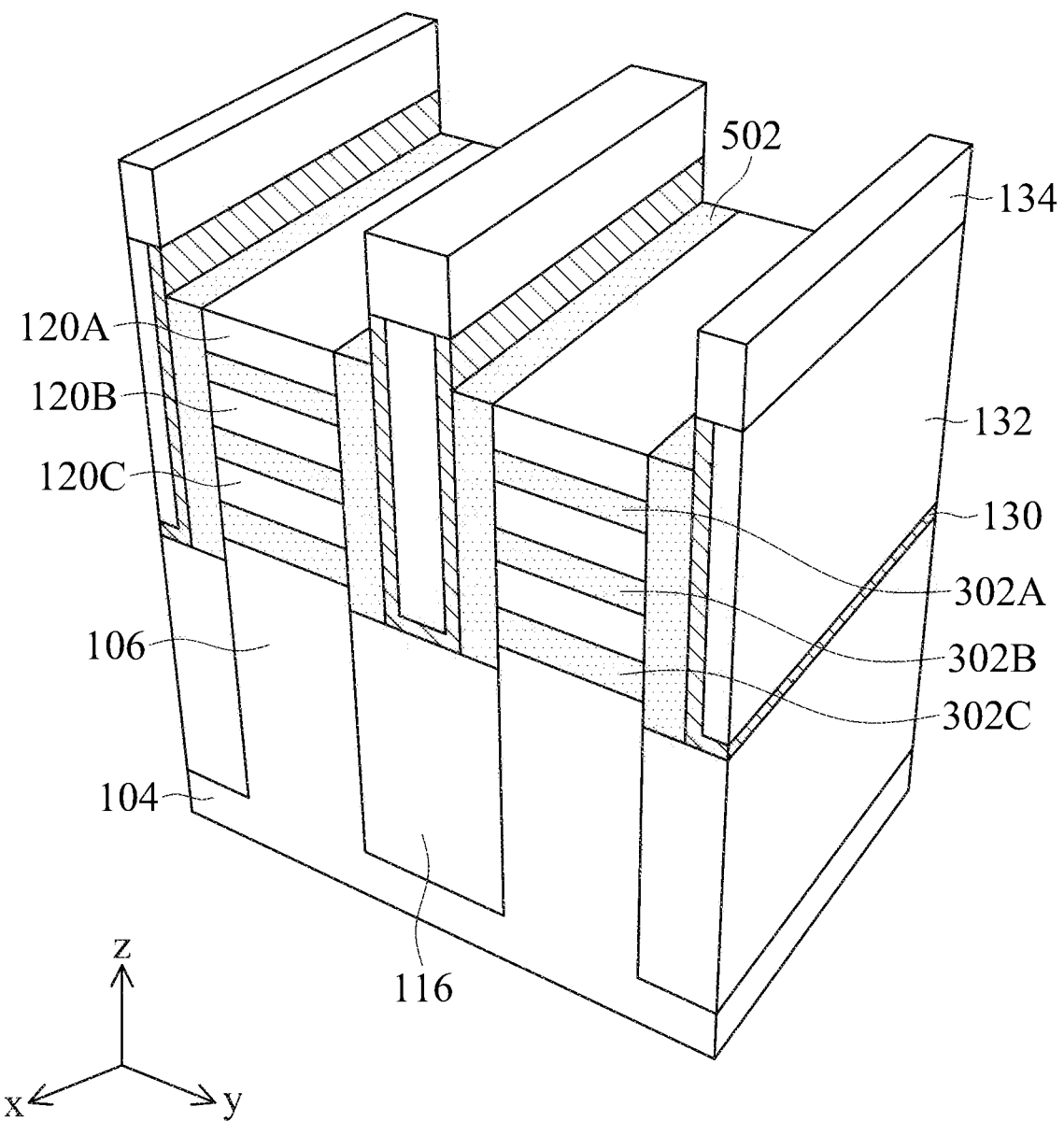

Referring to FIG. 2A, in operation 214, top Si layers, top SiGe layers, and portions of the cladding layers are removed to expose the second-type nanostructured layers. For example, as shown in FIG. 9, top Si layers 304, top SiGe layers 302D, and portions of cladding layers 502 along sidewalls of top Si layers 304 and top SiGe layers 302D are removed and second-type nanostructured layers 120A are exposed. Top Si layers 304, top SiGe layers 302D, and portions of cladding layers 502 can be removed and recessed by an etching process (e.g., reactive ion etching and other dry etching process using a chlorine (Cl) and fluorine (F) based etchant).

Figure 10:
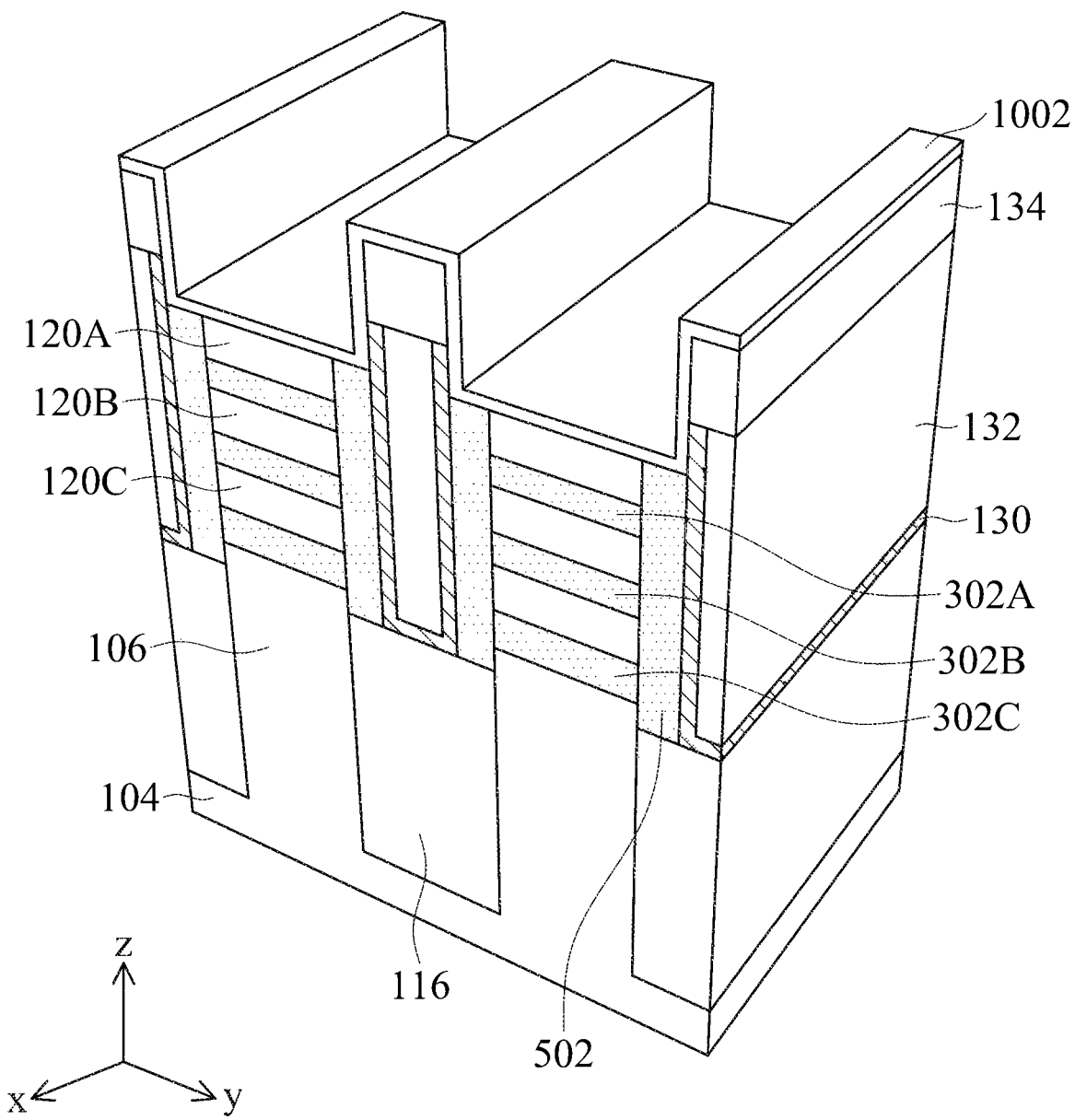

Referring to FIG. 2A, in operation 216, an IO layer is deposited on the exposed second-type nanostructured layers and the rare earth metal oxide layer. For example, as shown in FIG. 10, an IO layer 1002 is deposited on rare earth metal oxide layers 134, second-type nanostructured layers 120A, and cladding layers 502. IO layer 1002 can be an insulating material and can be deposited using CVD, PVD, and PECVD.

Figure 11:
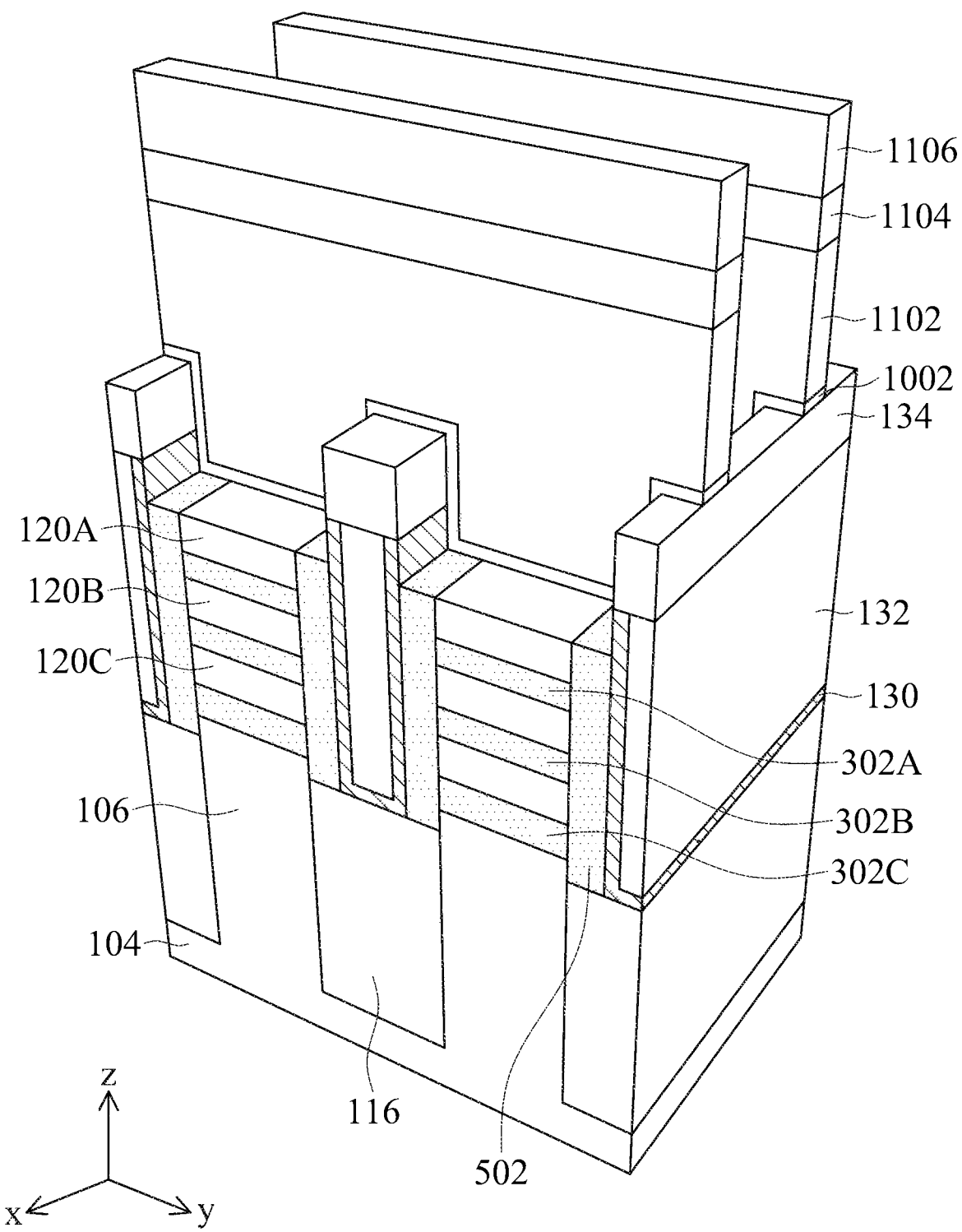

Referring to FIG. 2A, in operation 218, polysilicon structures are formed over the IO layer. For example, as shown in FIG. 11, polysilicon structures 1102 are formed over fin structures 106 and IO layers 1002. The formation of polysilicon structures 1102 can include blanket depositing a layer of polysilicon material over fin structures 106 and IO layer 1002 using CVD, PVD, ALD, and other suitable deposition processes, and removing portions of the layer of polysilicon material using a photolithographic patterning process and an etching process. Portions of IO layers 1002 can also be removed by the etching process. In some embodiments, $Si_3N_4$ hard mask layers 1104 and $SiO_2$ hard mask layers 1106 can be formed on polysilicon structures 1102. $Si_3N_4$ hard mask layers 1104 and $SiO_2$ hard mask layers 1106 can be deposited using CVD, PVD, and PECVD and patterned using the photolithographic patterning process and the etching process.

Figure 12:
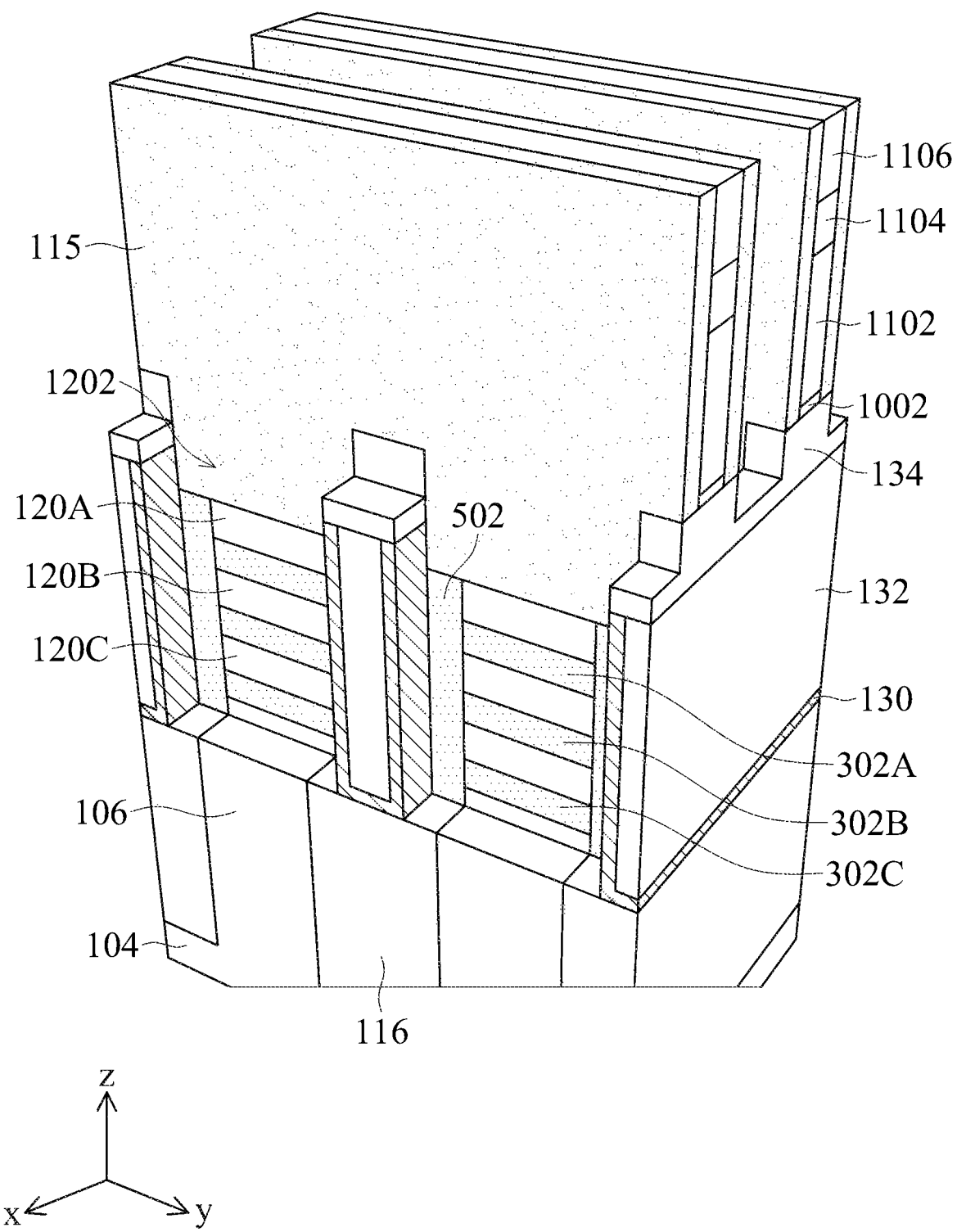

Referring to FIG. 2A, in operation 220, spacers are formed on the polysilicon structure and portions of the fin structures adjacent to the polysilicon structure are removed to form S/D openings. For example, as shown in FIG. 12, spacers 115 are formed on polysilicon structures 1102. The formation of spacers 115 can include blanket depositing a layer of an insulating material (e.g., an oxide and a nitride material) over fin structures 106 and polysilicon structures 1102 by a CVD, a PVD, and an ALD process followed by an etching process (e.g., reactive ion etching and other dry etching process using a chlorine (Cl) and fluorine (F) based etchant).

Also as shown in FIG. 12, portions of fin structures 106 adjacent to polysilicon structures 1102 are removed to form S/D openings 1202. S/D openings 1202 can be formed by a dry etching process (e.g., reactive ion etching process). The dry etching process can use a gas mixture having $C_xF_y$, $N_2$, and Ar. S/D openings 1202 can be formed by a wet etching process, additionally and/or alternatively. The wet etching process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and a combination thereof. The etching process can be a selective etching and a timed etching. Rare earth metal oxide layers 134 can protect isolation layers 132 and liners 130 from the etching process during the formation of S/D openings 1202. Protected isolation layers 132 and liners 130 can function as barriers between adjacent S/D regions during the epitaxial growth of the S/D regions. Protected isolation layers 132 and liners 130 can prevent the S/D regions from merging together. Unmerged S/D regions can reduce circuit complexity and improve device performance and reliability.

Figure 13:
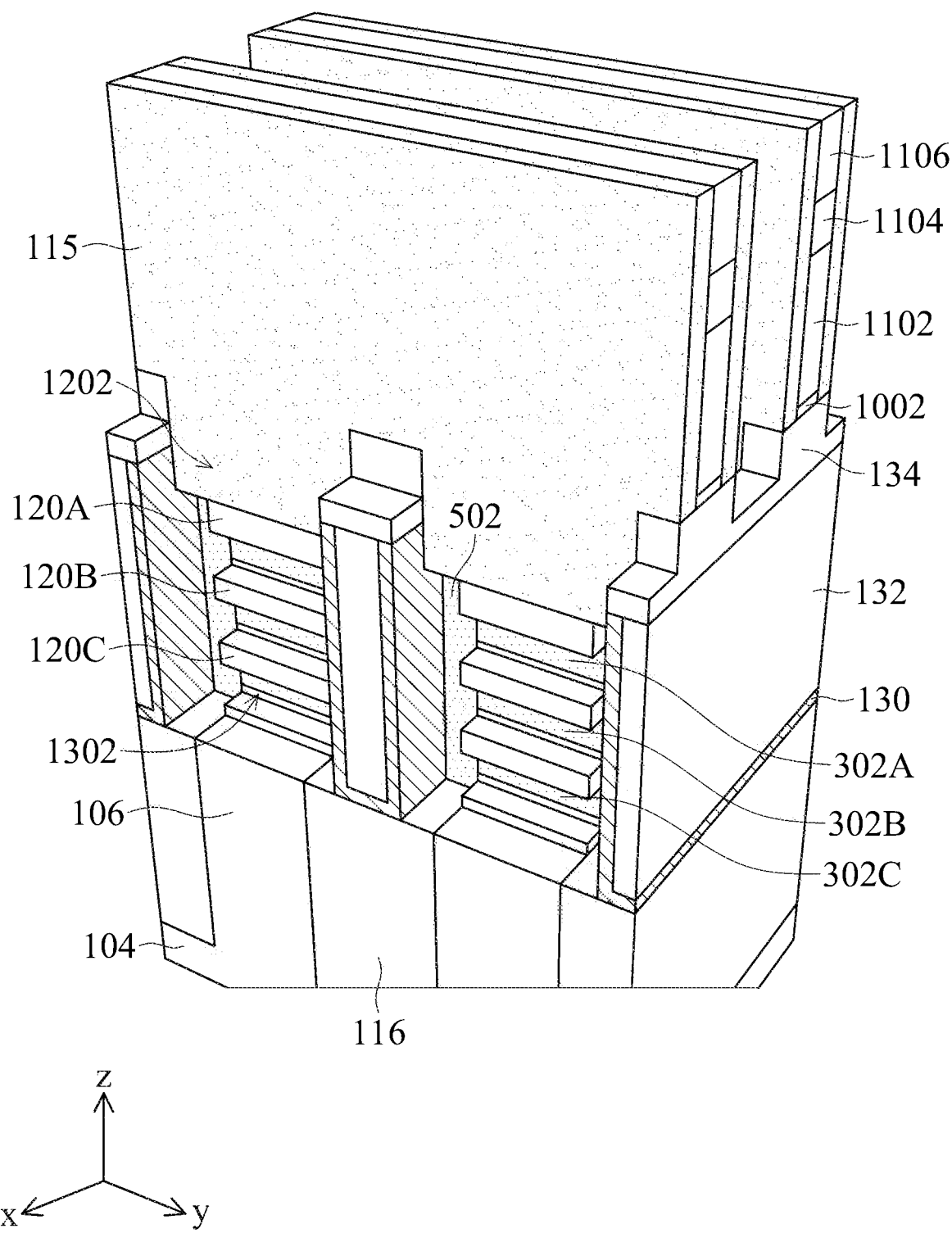

Referring to FIG. 2B, in operation 222, ends of the first-type nanostructured layers and the cladding layers are etched. For example, as shown in FIG. 13, the ends of first-type nanostructured layers 302A-302C and cladding layers 502 are etched to form inner spacer openings 1302. The ends of first-type nanostructured layers 302A-302C and cladding layers 502 can be etched by a dry etch. The dry etch can be a non-plasma chemical etching using fluorine ($F_2$) and hydrogen fluoride (HF).

Figure 14:
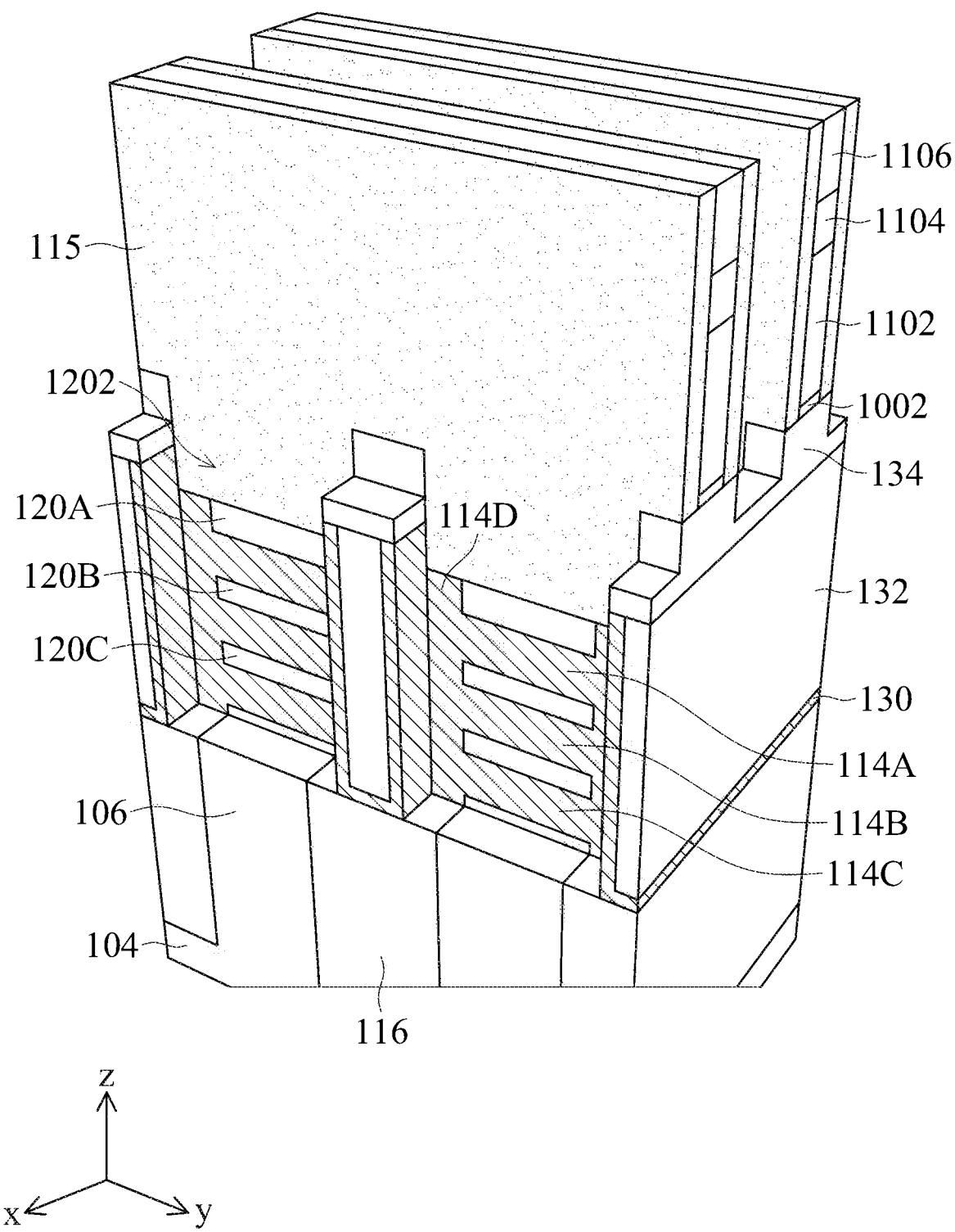

Referring to FIG. 2B, in operation 224, inner spacers are formed at the ends of the first-type nanostructured layers and the cladding layers. For example, as shown in FIG. 14, inner spacers 114A-114D are formed at the ends and sides of first-type nanostructured layers 302A-302C and cladding layers 502. The formation of inner spacers 114A-114D can include filling inner spacer openings 1302 with a dielectric material using CVD and ALD. The formation of inner spacers 114A-114D can include blanket depositing the dielectric material in and around inner spacer openings 1302 and etching the excess dielectric material outside inner spacer openings 1302.

Figure 15:
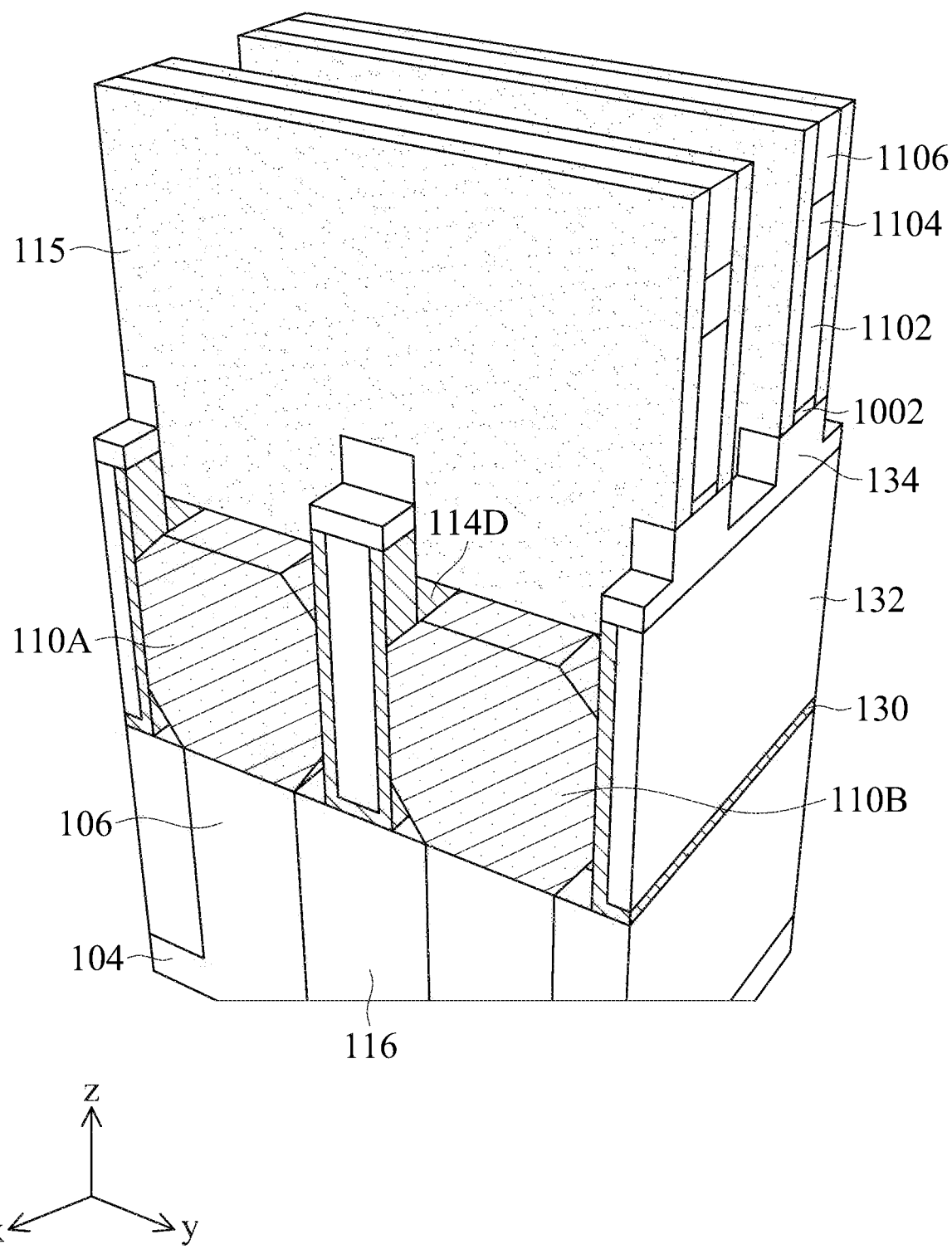

Referring to FIG. 2B, in operation 226, S/D regions are formed in the removed portions of the fin structures. For example, as shown in FIG. 15, S/D regions 110A and 110B are formed in S/D openings 1202. By way of example and not limitation, S/D regions 110A and 110B can be epitaxially grown using source gases, such as silane ($SiH_4$), silicon tetrachloride ($SiCl_4$), trichlorosilane (TCS), and dichlorosilane ($SiH_2Cl_2$ and DSC). Hydrogen ($H_2$) can be used as a reactant gas to reduce the aforementioned source gases. For example, $H_2$ can combine with Cl to form hydrogen chloride (HCl), leaving Si to epitaxially grow in S/D regions 110A and 110B. The growth temperature during the epitaxial growth can range from about 700° C. to about 1250° C. depending on the gases used. According to some embodiments, S/D regions 110A and 110B can have the same crystallographic orientation as substrate 104 and fin structures 106 since substrate 104 and fin structures 106 can act as a seed layer for S/D regions 110A and 110B. In some embodiments, a top surface of S/D regions 110A and 110B can be parallel to the (100) crystal plane. S/D regions 110A and 110B can be in-situ doped during their epitaxial growth process using p-type dopants, such as B, In, and Ga, or n-type dopants, such as P and As. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and other n-type doping precursor can be used. During the formation of S/D regions 110A and 110B, if the height of isolation layers 132 and liners 130 is below a predetermined threshold, S/D regions 110A and 110B can merge together over isolation layers 132 and liners 130. Merged S/D regions 110A and 110B can increase circuit complexity. Rare earth metal oxide layers 134 can protect isolation layers 132 and liners 130 from the etching process during the formation of S/D openings 1202. The height of protected isolation layers 132 and liners 130 can be greater than the predetermined threshold and prevent S/D regions 110A and 110B from merging together over isolation layers 132 and liners 130.

Figure 16:
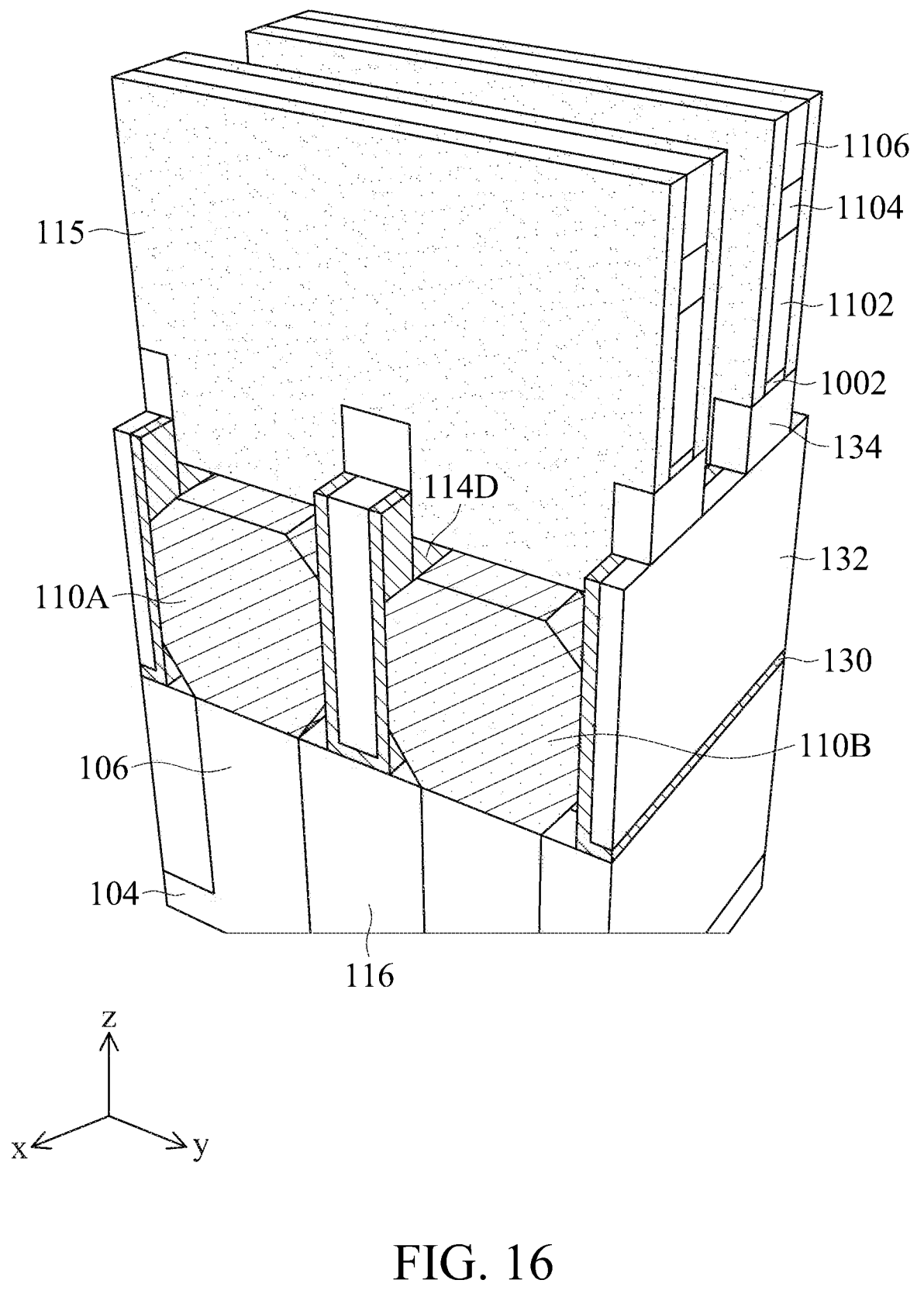

Referring to FIG. 2B, in operation 228, the rare earth metal oxide layers adjacent to the spacers are removed. For example, as shown in FIG. 16, rare earth metal oxide layers 134 adjacent to spacers 115 are removed. Rare earth metal oxide layers 134 adjacent to spacers 115 can be removed by an etching process (e.g., reactive ion etching and other plasma-enhanced dry etching process using a chlorine (Cl) and fluorine (F) based etchant). Rare earth metal oxide layers 134 below spacers 115, IO layers 1002, and polysilicon structures 1102 remain.

Figure 17A:
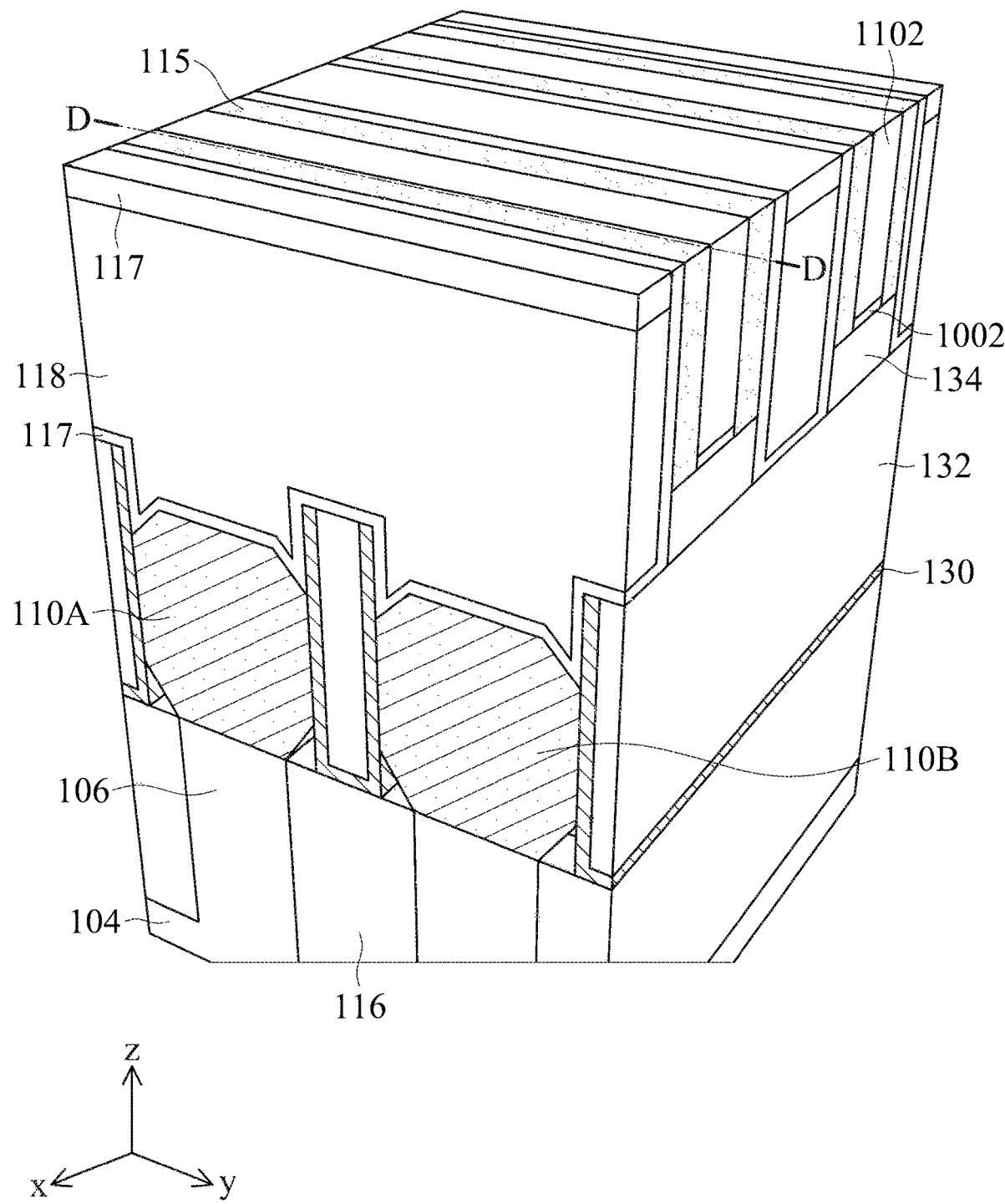
Figure 17B:
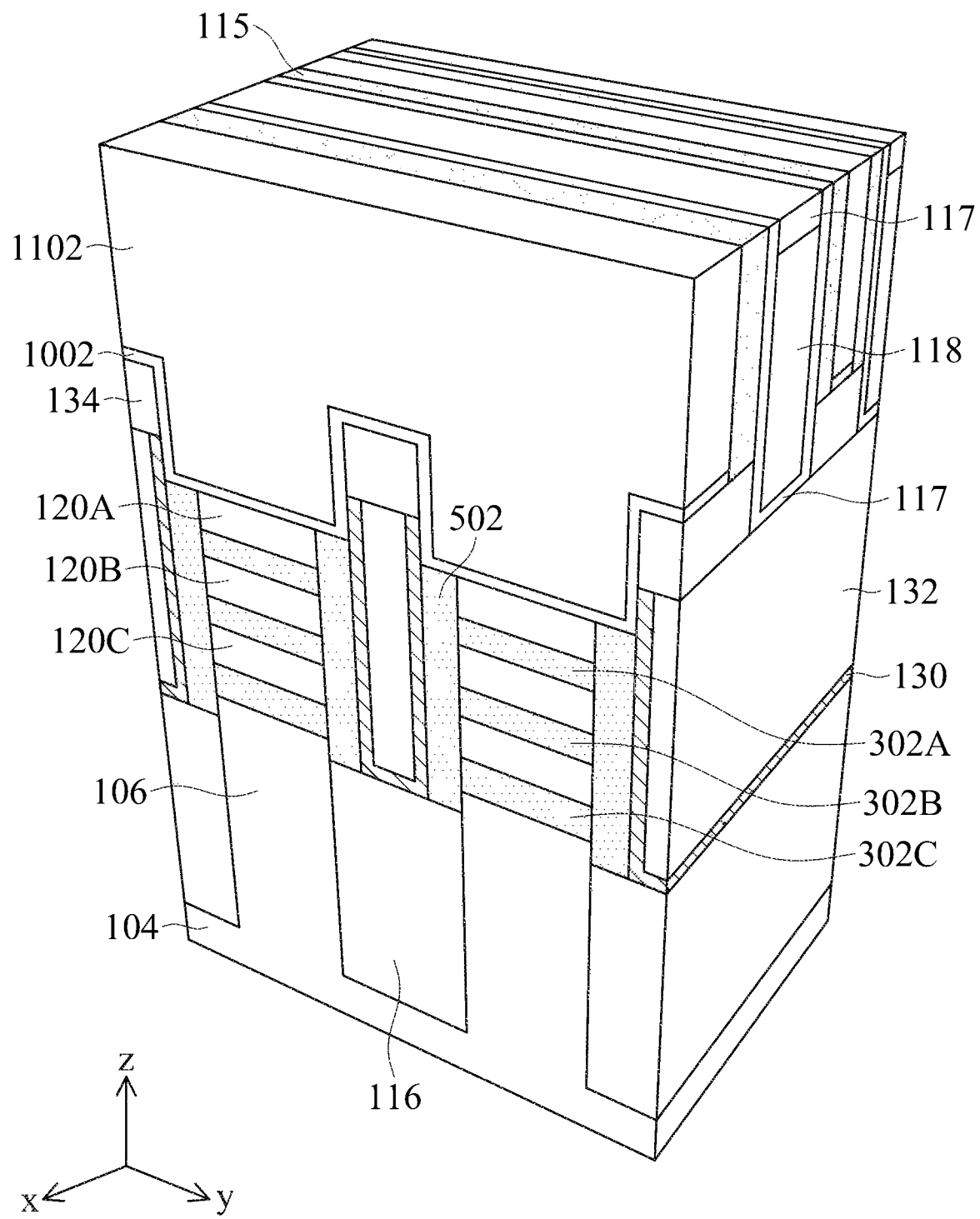

Referring to FIG. 2B, in operation 230, ESLs and ILD layers are deposited on the spacers and on the S/D regions. For example, as shown in FIG. 17A, ESLs 117 and ILD layers 118 are deposited on spacers 115 and S/D regions 110A and 110B. ESLs 117 and ILD layers 118 can be insulating materials deposited using PVD, CVD, and PECVD. In some embodiments, a CMP process can follow the deposition of ESLs 117 and ILD layers 118, such that $Si_3N_4$ hard mask layers 1104 and $SiO_2$ hard mask layers 1106 can be polished and polysilicon structures 1102 can be exposed for removal in the following operation. The following operations are described with respect to FIGS. 17B-20. FIG. 17B-20 illustrate isometric views of the device shown in FIG. 17A viewed from the line D-D for ease of description of the structures hidden in FIG. 17A.

Figure 18:
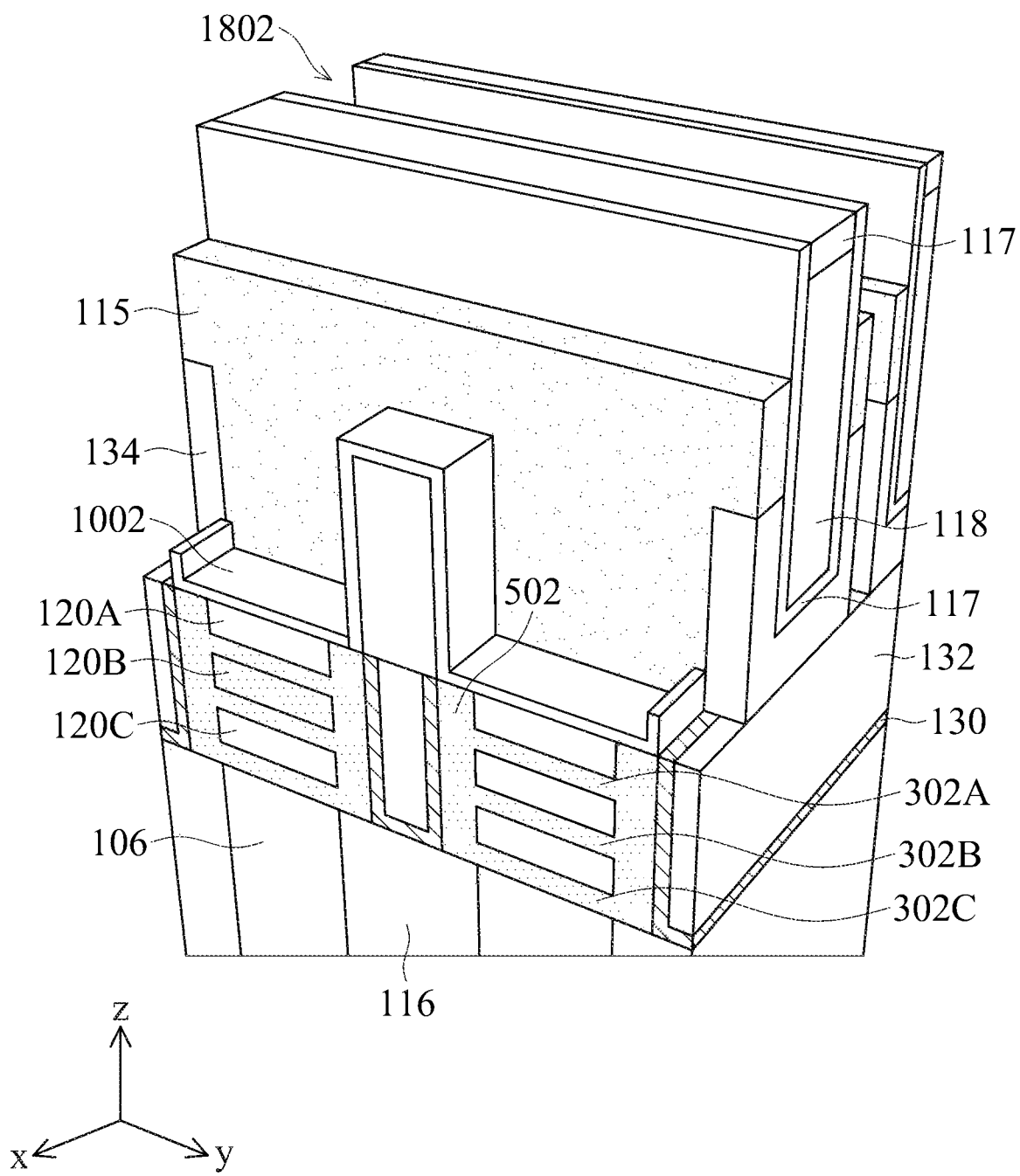

Referring to FIG. 2B, in operation 232, the polysilicon structures are removed. For example, as shown in FIG. 18, polysilicon structures 1102 are removed to form polysilicon openings 1802. Removal of polysilicon structures 1102 can be achieved using a dry etching process (e.g., reactive ion etching) and a wet etching process, each having a higher etching rate towards polysilicon structures 1102 and a lower etching rate towards spacers 115. In some embodiments, the gas etchants used in the dry etching process can include Cl, F, bromine (Br), and a combination thereof. In some embodiments, an ammonium hydroxide ($NH_4OH$), sodium hydroxide (NaOH), and potassium hydroxide (KOH) wet etching can be used to remove polysilicon structures 1102.

Figure 19:
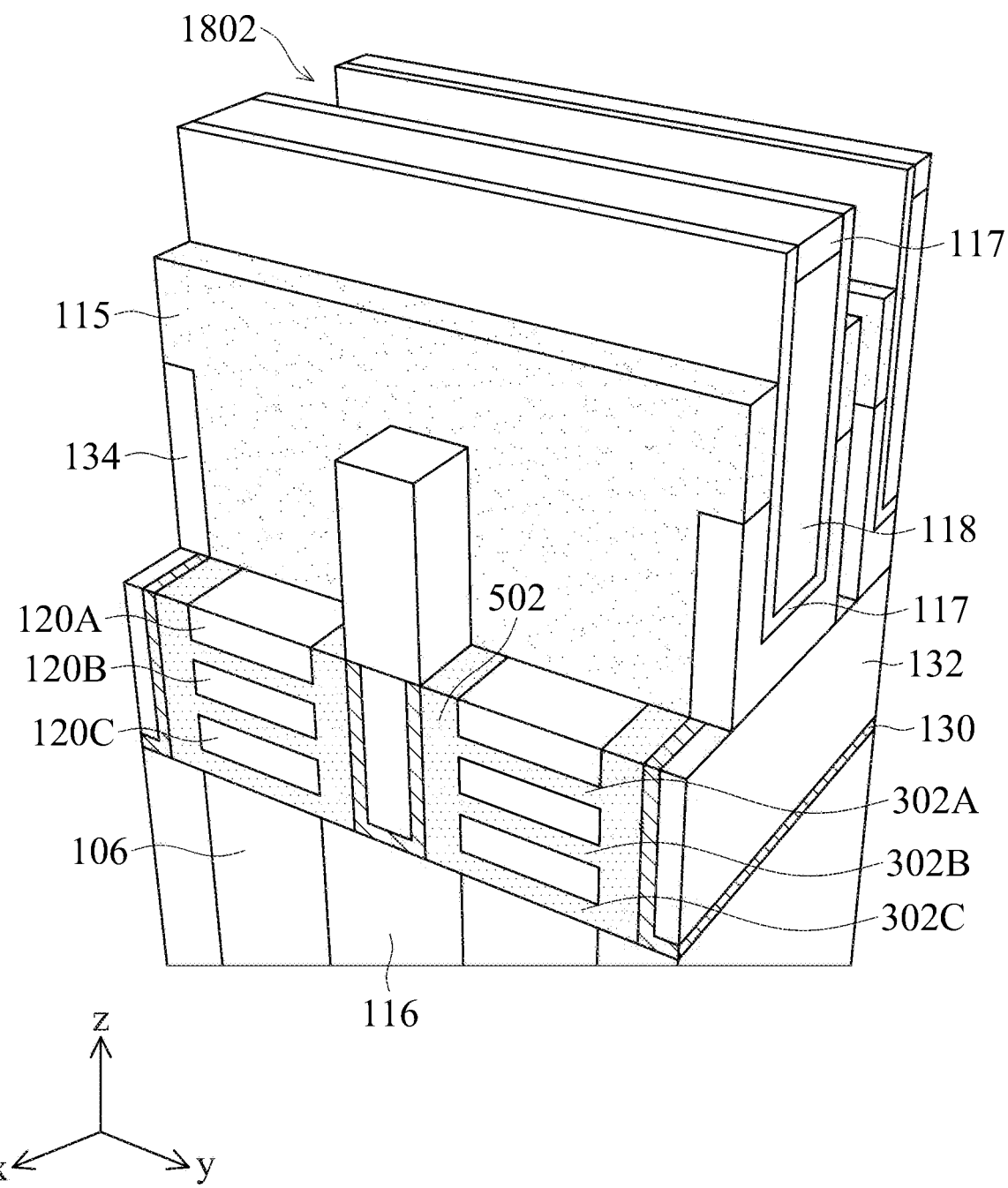

Referring to FIG. 2B, in operation 234, the IO layers are removed. For example, as shown in FIG. 19, IO layers 1002 are removed. Removal of IO layers 1002 can be achieved by an etching process (e.g., reactive ion etching and other plasma-enhanced dry etching process using a chlorine (Cl) and fluorine (F) based etchant). The dry etching process can have a higher etching rate towards IO layers 1002 and a lower etching rate towards second-type nanostructured layers 120A, cladding layers 502, and spacers 115.

Figure 20:
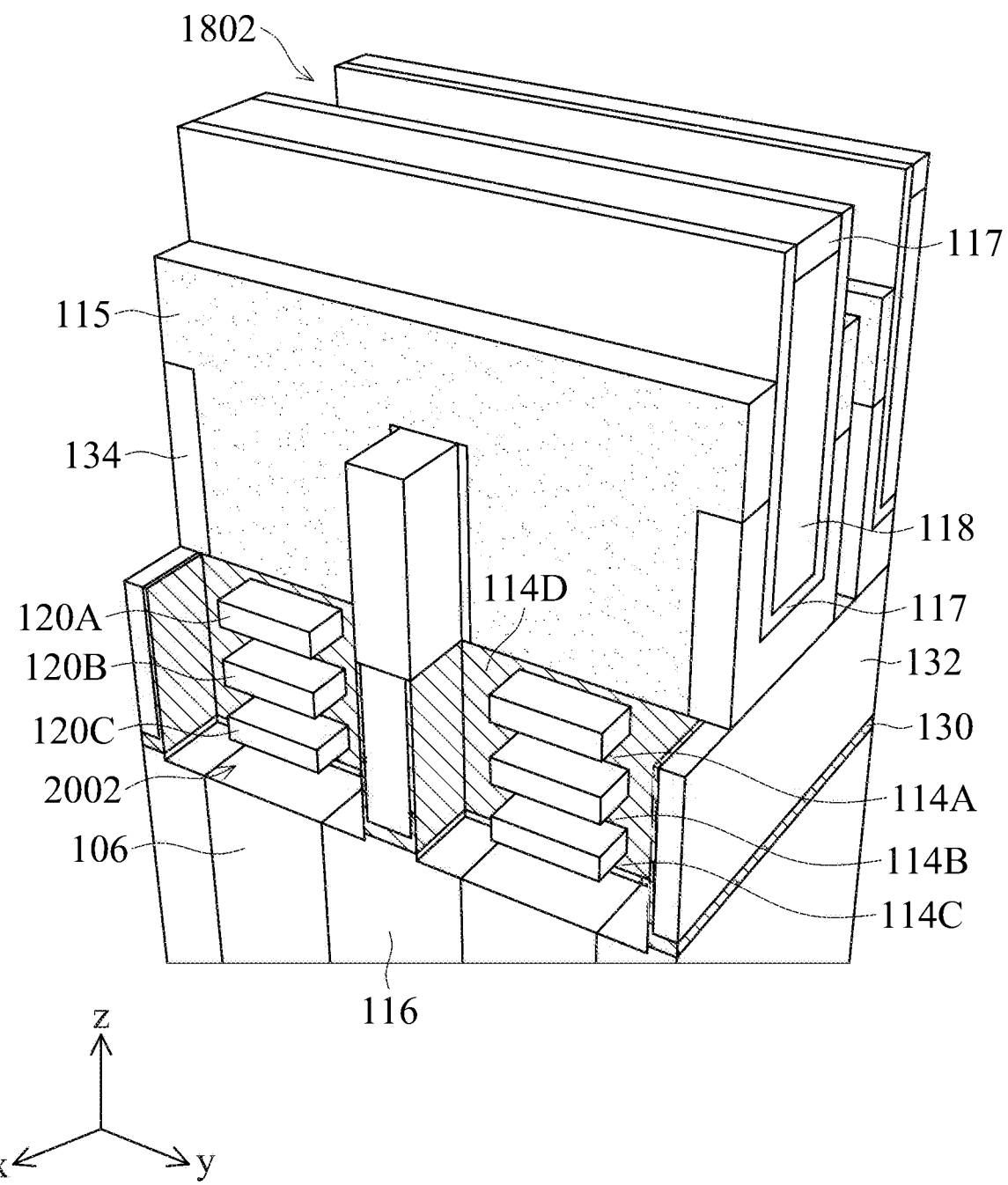

Referring to FIG. 2B, in operation 236, middle portions of the first-type nanostructured layers of the superlattice structures and the cladding layers are removed. For example, as shown in FIG. 20, the middle portions of first-type nanostructured layers 302A-302C and cladding layers 502 are removed to form first-type nanostructure openings 2002. Removal of the middle portions of first-type nanostructured layers 302A-302C and cladding layers 502 can be achieved using a dry etching process (e.g., reactive ion etching) and a wet etching process, each having a higher etching rate towards the middle portions of first-type nanostructured layers 302A-302C and cladding layers 502 and a lower etching rate towards fin structures 106 and inner spacers 114A-114D. In some embodiments, the middle portions of first-type nanostructured layers 302A-302C and cladding layers 502 can be etched in a manner similar to the polysilicon structure etching described with reference to FIG. 18. In some embodiments, the middle portions of first-type nanostructured layers 302A-302C and cladding layers 502 can be etched in a manner similar to the first-type nanostructured layer end etching described with reference to FIG. 13.

Referring to FIG. 2B, in operation 238, after the polysilicon openings and the first-type nanostructure openings 2002 are formed, gates structures are formed in spaces previously occupied by the polysilicon structures and the middle portions of the first-type nanostructured layers and the cladding layers. For example, gate structures 112 can be formed in polysilicon openings 1802 and first-type nanostructure openings 2002. Gate structures 112 can include a multi-layered structure with IO layer, HK gate dielectric layer, WFM layer, and gate metal fill layer. The IO layer can be deposited using PECVD, CVD, and ALD. The HK gate dielectric layer can be deposited using PECVD, CVD, PVD, and ALD. The WFM layer can be deposited by PECVD, CVD, PVD, ALD, metal organic chemical vapor deposition (MOCVD), sputtering, other suitable deposition methods, and a combination thereof. The gate metal fill layer can be formed by PECVD, CVD, PVD, ALD, MOCVD, sputtering, other suitable deposition methods, and a combination thereof.

The present disclosure provides example FET devices (e.g., FET 100, GAA FETs, finFETs, and planar FETs) with a rare earth metal oxide layer (e.g., rare earth metal oxide layer 134) in a semiconductor device and/or in an integrated circuit (IC) and an example method (e.g., method 200) for fabricating the same. The rare earth metal oxide layer can be formed on the top portion of the isolation layer (e.g., isolation layer 132) to protect the top portion of the isolation layer from etching. There can be two methods for forming the rare earth metal oxide layer on the top portion of the isolation layer. The first method can be rare earth metal implantation on the top portion of both the isolation layer and the fin structures (e.g., fin structures 106). There can be a post-implantation anneal. The rare earth metal can react with the isolation layer to form the rare earth metal oxide layer. The top portion of the implanted fin structures can be removed, leaving the isolation layer with the rare earth metal oxide layer on the top portion of the isolation layer. The second method can be rare earth metal oxide deposition. The top portion of the isolation layer can be removed to form an isolation layer opening (e.g., isolation layer opening 802). The rare earth metal oxide layer can be deposited in the isolation layer opening and on the fin structures. The deposition can be atomic layer deposition (ALD). There can be a post-deposition anneal. The excess rare earth metal oxide layer on the isolation layer and on the fin structures can be polished using chemical-mechanical planarization (CMP). When forming the S/D regions (e.g., S/D regions 110A and 110B), portions of the fin structures adjacent to the gate structure (e.g., gate structure 112) can be removed by etching. The S/D regions can be epitaxially grown in the removed portions (e.g., S/D openings 1202) of the fin structures. During the etching of the portions of the fin structures, the rare earth metal oxide layer can protect the top portion of the isolation layer from being removed. If too much of the top portion of the isolation layer is removed, the epitaxially-grown S/D regions can merge together over the isolation layer. The merged S/D regions can increase the complexity of the circuit design and reduce device performance and reliability. Protected isolation layer can prevent the S/D regions from merging together over the isolation layer. Therefore, the rare earth metal oxide layer can reduce circuit complexity and improve device performance and reliability.

In some embodiments, a method includes forming fin structures on a substrate and forming superlattice structures on the fin structures, where each of the superlattice structures includes a first-type nanostructured layer and a second-type nanostructured layer. The method further includes forming an isolation layer between the superlattice structures, implanting a rare earth metal into a top portion of the isolation layer to form a rare earth metal oxide layer, and forming a polysilicon structure over the superlattice structures. The method further includes etching portions of the superlattice structures adjacent to the polysilicon structure to form a source/drain (S/D) opening and forming an S/D region in the S/D opening.

In some embodiments, a method includes forming fin structures on a substrate and forming superlattice structures on the fin structures, where each of the superlattice structures includes a first-type nanostructured layer and a second-type nanostructured layer. The method further includes forming an isolation layer between the superlattice structures, removing a top portion of the isolation layer to form an opening, and forming a rare earth metal oxide layer in the opening. The method further includes etching a portion of the superlattice structures to form a source/drain (S/D) opening and forming an S/D region in the S/D opening.

In some embodiments, a semiconductor device includes superlattice structures disposed on a substrate, an isolation layer interposed between the superlattice structures, and a gate structure disposed over the superlattice structures. The semiconductor device further includes a source/drain (S/D) region disposed on a portion of the superlattice structures and adjacent to the gate structure and a rare earth metal oxide layer interposed between the isolation layer and the gate structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming fin structures on a substrate;
    forming superlattice structures on the fin structures, wherein each of the superlattice structures comprises a first-type nanostructured layer and a second-type nanostructured layer;
    forming an isolation layer between the superlattice structures;
    implanting a rare earth metal into a top portion of the isolation layer to form a rare earth metal oxide layer;
    forming a polysilicon structure over the superlattice structures;

etching portions of the superlattice structures adjacent to the polysilicon structure to form a source/drain (S/D) opening; and forming an S/D region in the S/D opening.

2. The method of claim 1, further comprising annealing the substrate after implanting at a temperature between about 600° C. and about 1000° C. for a duration between about 1 second and about 300 seconds.

3. The method of claim 1, wherein implanting the rare earth metal into the top portion of the isolation layer comprises using an ion beam energy between about 1 keV and about 10 keV, and a rare earth metal dose between about $1 \times 10^{15}$ ions/cm$^2$ and about $1 \times 10^{16}$ ions/cm$^2$.

4. The method of claim 1, wherein a rare earth metal concentration in the rare earth metal oxide layer is between about $1 \times 10^{21}$ atoms/cm$^3$ and about $3 \times 10^{22}$ atoms/cm$^3$.

5. The method of claim 1, wherein a ratio between a thickness of the rare earth metal oxide layer and a thickness of the isolation layer ranges from about 0.01 to about 0.3.

6. The method of claim 1, further comprising forming silicon capping layers on the superlattice structures.

7. The method of claim 1, further comprising:
forming a silicon germanium etch stop layer on each of the superlattice structures; and
forming a silicon etch stop layer on the silicon germanium etch stop layer, wherein the silicon etch stop layer has a thickness greater than thicknesses of the first-type nanostructured layer and the second-type nanostructured layer.

8. The method of claim 1, further comprising:
replacing an end of the first-type nanostructured layer with an inner spacer; and
replacing a middle portion of the first-type nanostructured layer with a gate region.

9. The method of claim 8, further comprising:
forming a cladding layer on each of the superlattice structures, wherein a material of the cladding layer and a material of the first-type nanostructured layer are similar to each other; and
forming a liner on the cladding layer.

10. The method of claim 9, further comprising implanting the rare earth metal into top portions of the cladding layer and the liner.

11. A method, comprising:
forming fin structures on a substrate;
forming superlattice structures on the fin structures, wherein each of the superlattice structures comprises a first-type nanostructured layer and a second-type nanostructured layer;
forming an isolation layer between the superlattice structures;
removing a top portion of the isolation layer to form an opening;
forming a rare earth metal oxide layer in the opening;
etching a portion of the superlattice structures to form a source/drain (S/D) opening; and
forming an S/D region in the S/D opening.

12. The method of claim 11, wherein forming the rare earth metal oxide layer comprises depositing the rare earth metal oxide layer with an atomic layer deposition (ALD) process at a temperature between about 100° C. and about 400° C.

13. The method of claim 11, further comprising annealing the substrate after forming the rare earth metal oxide layer at a temperature between about 600° C. and about 1000° C. for a duration between about 1 second and about 300 seconds.

14. The method of claim 11, further comprising:
replacing an end of the first-type nanostructured layer with an inner spacer; and
replacing a middle portion of the first-type nanostructured layer with a gate region.

15. The method of claim 14, further comprising:
forming a cladding layer on each of the superlattice structures, wherein a material of the cladding layer and a material of the first-type nanostructured layer are similar to each other; and
forming a liner on the cladding layer.

16. The method of claim 15, wherein removing the top portion of the isolation layer to form the opening comprises removing a top portion of the liner, and wherein forming the rare earth metal oxide layer in the opening comprises polishing the rare earth metal oxide layer and the cladding layer.

17. A semiconductor device, comprising:
superlattice structures disposed on a substrate;
an isolation layer interposed between the superlattice structures;
a gate structure disposed over the superlattice structures;
a source/drain (S/D) region disposed on a portion of the superlattice structures and adjacent to the gate structure; and
a rare earth metal oxide layer interposed between the isolation layer and the gate structure.

18. The semiconductor device of claim 17, further comprising a liner surrounding the isolation layer and below the rare earth metal oxide layer.

19. The semiconductor device of claim 17, wherein a thickness of the rare earth metal oxide layer is between about 1 nm and about 20 nm.

20. The semiconductor device of claim 17, wherein a ratio between a thickness of the rare earth metal oxide layer and a thickness of the isolation layer is between about 0.02 and about 0.2.

* * * * *